(12) United States Patent
Morii

(10) Patent No.: US 7,273,637 B2
(45) Date of Patent: Sep. 25, 2007

(54) THIN FILM, THIN FILM MANUFACTURING METHOD, THIN FILM MANUFACTURING APPARATUS, ORGANIC EL DEVICE, ORGANIC EL DEVICE MANUFACTURING METHOD AND ELECTRONIC EQUIPMENT

(75) Inventor: Katsuyuki Morii, Suwa (JP)

(73) Assignee: Seiko Epson Corporation (JP)

( * ) Notice: Subject to any disclaimer, the term of this patent is extended or adjusted under 35 U.S.C. 154(b) by 128 days.

(21) Appl. No.: 10/392,287

(22) Filed: Mar. 18, 2003

(65) Prior Publication Data

US 2004/0242111 A1 Dec. 2, 2004

(30) Foreign Application Priority Data

Mar. 20, 2002 (JP) ............................. 2002-079508

(51) Int. Cl.
*B05D 5/06* (2006.01)
*B05D 1/38* (2006.01)
*B05D 3/02* (2006.01)
*B05D 3/04* (2006.01)
*B05D 3/10* (2006.01)

(52) U.S. Cl. ..................... 427/256; 427/68; 427/384

(58) Field of Classification Search .................. 427/66, 427/68, 256, 372.2, 384
See application file for complete search history.

(56) References Cited

U.S. PATENT DOCUMENTS 5,932,309 A * 8/1999 Smith et al. .................. 428/46

6,623,097 B2 * 9/2003 Okada et al. ................. 347/21

FOREIGN PATENT DOCUMENTS

| JP | 11-054272 | 2/1999 |
|---|---|---|
| JP | 2001-102170 | 4/2001 |
| JP | 2001-167878 | 6/2001 |
| JP | 2001-341296 | * 12/2001 |

OTHER PUBLICATIONS

JPO machine translation of JP 2001-341296 (Dec. 2001).*
Examination result issued in corresponding Japanese application.

* cited by examiner

*Primary Examiner*—William Philip Fletcher, III
(74) *Attorney, Agent, or Firm*—Harness, Dickey & Pierce, P.L.C.

(57) ABSTRACT

A thin film is formed from a solution including a component for forming the film and a solvent. By removing solvent molecules from the thin film until, effectively, none of the solvent molecules exist any longer in the atmosphere near the surface of the film while the atmosphere is at room temperature and a pressure 1 Pa or below, a thin film layer is formed from the solution including the film-forming component and the solvent. After the formation, vapor incursion from the solvent into subsequent processes is prevented.

11 Claims, 16 Drawing Sheets

(a)

(b)

(c)

THIN FILM, THIN FILM MANUFACTURING METHOD, THIN FILM MANUFACTURING APPARATUS, ORGANIC EL DEVICE, ORGANIC EL DEVICE MANUFACTURING METHOD AND ELECTRONIC EQUIPMENT

BACKGROUND OF THE INVENTION

1. Technical Field

The present invention relates to a method for manufacturing thin films, and particularly to a method of manufacturing an organic electro luminescent (EL) device.

2. Background Technology

In recent years, electronic devices incorporating organic molecules, primarily organic electro luminescent (EL) devices, have begun to receive special emphasis in academia and industry. Echoing this trend, also from the aspect of processes, there has been an accelerating shift of attention from vacuum-based processes to solution processing, since the latter requires less energy. If one considers elements having multi-layer films manufactured by solvent-based processes, it is clear that the adjacent thin film layers must be formed with different solvent groups. In other words, assuming that one layer is formed with organic solvent, it is necessary that adjacent thin films, above and below that layer, be formed with aqueous solvents, which do not mix with the organic solvent. The reason is, if it is attempted to create contiguous layers of the same family of solvents, the two layers will mix together, defeating the purpose of creating distinct, sequential, multiple layers. Namely, each thin film manufactured by solvent-based processes is exposed to both solvent families: the solvent with which it is formed or wherein it dissociates, and the atmosphere of the layer onto which it was formed or of the layer formed on top of it. This fact poses a problem for functional thin layers. Some functional thin layers are known to be functionally degraded by exposure to another family of solvents. One example of this is the oxidation deterioration and shortened lifetime of polymers after exposure to water. There has also sometimes been inadequate control of the atmosphere to prevent atmospheric fouling, however, and this subject has not been adequately investigated. Nevertheless, since fouling is concentrated at the interface, the key to functional expression, prevention of atmospheric fouling is considered to be very important.

SUMMARY OF THE INVENTION

The present invention is intended as an attempt to rectify the above situation. One objective is to prevent introduction of the atmosphere in an apparatus, which has formed a newly thin film layer, into subsequent processes.

Thus, according to an aspect of a method of manufacturing thin films in this invention, a thin film is formed by applying droplets of a solution including a component for forming the film and a solvent, and the molecules of the solvent are removed until, effectively, no solvent molecules exist any longer in the atmosphere near the thin film.

By this method, it is possible to ensure that, effectively, no molecules of the solvent exist any longer in the atmosphere near the thin film, that they are not introduced into subsequent processes, and that they are prevented from evaporating from the manufactured thin film or damaging other substances.

Also, in order to remove solvent molecules from the atmosphere, it is desirable to depressurize the atmosphere in the apparatus.

Depressurization allows effective removal of solvent molecules existing in the solution.

In order to remove the solvent molecules, the thin film may also be heated, while depressurizing or instead of depressurizing the interior of the apparatus.

Also, by heating, the solvent molecules existing in the solution can be removed, and by heating together with the aforementioned depressurization in the apparatus, an even more effective removal of solvent molecules existing in the solution is possible.

In order to remove the solvent molecules, it is preferable to supply an inert gas to the vicinity of the thin film in addition to the depressurization or the heating of the thin film.

This allows a more effective removal of solvent molecules existing in the solution.

The thin film is preferably formed on a substrate.

Generally, it is easy to form the thin film on a substrate that is a supporting body. Possible substrate materials are a film electrode (this is one kind of substrate), a silicon substrate, a glass substrate, a glass plate with electrodes and other features attached, a plastic film, and others. It is also possible to strip the thin film from these substrates to obtain a single thin film.

It is preferable to apply small liquid droplets to the substrate material as the method of forming a thin film from the solution.

A representation of this method is to apply small liquid droplets to a substrate by the ink-jet method. By using this method, it is possible to create a detailed pattern, and the thin film formed in the effective absence of the solvent molecules in the atmosphere of its vicinity.

According to an aspect of this invention, the thin film is formed by the above manufacturing method.

Solvent molecules do not evaporate from this kind of thin film or damage other substances.

According to an aspect of this invention, the apparatus for manufacturing thin films comprises a coating apparatus which applies a solution including a component for forming a film and a solvent to a substrate and a removal apparatus which removes solvent molecules until a condition is reached wherein the solvent molecules no longer effectively exist in the atmosphere near the thin film formed with the applied solution.

Since no solvent molecules effectively exist in the surface atmosphere of this kind of thin film manufacturing apparatus, it is possible to manufacture a thin film wherein solvent molecules never damage other substances.

According to an aspect of this invention, in the method of manufacturing a multi layered thin film, droplets of the first solution including the first film-forming component and the first solvent are applied to a substrate material to form a thin film, and a second thin film is formed on the surface of the first thin film, which is manufactured by removing the solvent molecules until a condition is reached wherein the solvent molecules no longer effectively exist in the atmosphere near the thin film.

When this is accomplished, the second thin film is invulnerable to damaging action by the first destructive solvent It is preferable to form the second thin film from a second solution including a component for forming the second film and a second solvent.

Aside from this method of forming from a solution, evaporation deposition can also be used to form the second thin film, but both the apparatus and its operation are simpler for formation using a solution.

As a method for removing the molecules of the first solvent, after depressurizing the atmosphere or heating, in addition, the surroundings of the thin film can be filled with an inert gas. The inert gas used for this filling preferably includes molecules of the second solvent used for formation of the second thin film.

By this process, the second thin film layer deposited onto the first thin film layer has a better conformity to the first thin film layer.

The method by which the first or the second thin film is formed with the first or second solution preferably includes applying small liquid droplets of these solutions onto, respectively, the substrate or the first thin film.

When, for example, the multi layered thin film is a display apparatus having a hole injection/transfer layer and a light-emitting layer in an organic EL apparatus, since it is desirable for the film to exist in a small region, this small region can be easily and economically formed by employing the small liquid droplets.

The method for forming the thin film layer from the first solution or the second solution is preferably implemented with a different film-forming apparatus for different solvents to be used.

Using this method provides additional assurance that the atmosphere in the apparatus for forming each thin film layer is not introduced to the subsequent process.

According to an aspect of this invention, the multi layered thin film comprises both the first thin film and the second thin film manufactured as described above.

Polluting or degradation of function of the second thin film layer by molecules of the first solvent is effectively suppressed in the multi layered thin film manufactured in the aforementioned methods.

According to an aspect of this invention, the apparatus for manufacturing the multi layered thin film comprises a coating apparatus for applying a solution including a component for forming a film and a solvent on a substrate, a means for forming a first thin film by removing solvent molecules until a condition is reached wherein the solvent molecules no longer effectively exist in the atmosphere near the thin film formed with the applied solution, and a means for forming a second thin film on the first thin film.

With this apparatus, it is possible to manufacture a multi layered thin film whose second thin film is not subjected to destructive action by destructive molecules of the first solvent.

According to an aspect of this invention, also, an organic EL apparatus comprises a multi layered thin film in which the first thin film in the multi layered thin film apparatus is a hole injection/transfer layer, and the second thin film is a light-emitting layer in the multi layered thin film.

In this organic EL apparatus, after the solvent, e.g., water, has been effectively removed from the hole injection/transfer layer, the light-emitting layer is formed on it, so that degradation of the light-emitting layer by that solvent is effectively suppressed.

According to an aspect of this invention, the method of manufacturing an organic EL device comprises a process for forming a thin film by applying a solution including a component for forming a hole injection/transfer layer and a solvent on a substrate, a process for forming the hole injection/transfer layer by removing molecules of the solvent until a condition is reached wherein the solvent molecules no longer effectively exist in the atmosphere near the thin film, and a process for forming a light-emitting layer on this hole injection/transfer layer.

By using this method, degradation of the light-emitting layer by a solvent, e.g., water, is effectively suppressed in this organic EL device, after the solvent, e.g., water, together with components of the hole injection/transfer layer included in a solution, has been effectively removed.

According to an aspect of this invention, the apparatus for manufacturing an organic EL device comprises a means for applying a solution including a component for forming a hole injection/transfer layer and a solvent to a substrate, a means for forming a hole injection/transfer layer by removing the solvent molecules until a condition is reached wherein the solvent molecules no longer effectively exist in the atmosphere near the film formed with the applied solution, and a means for forming a light-emitting layer on this hole injection/transfer layer.

Since the solvent, e.g. water, with the hole injection/transfer layer components included in the solution, is effectively removed with this device, it is possible to manufacture an organic EL device wherein degradation of the light-emitting layer by water is extremely effectively suppressed.

This invention also offers electronic equipment having a display device, which is in the form of the aforementioned organic EL device.

This electronic equipment has a display device with the aforementioned superior qualities.

Moreover, in this specification, the term "solvent" means not only the conventional sense of a liquid with the capability of dissolution of substances, but also includes the sense of a dispersant, which has the capability of dispersing a solid powder.

Also, the term "solution" means not only the conventional sense of a solute dissolved in a solvent, but also includes the sense of a liquid containing a dispersed solid powder.

DESCRIPTION OF THE PREFERRED EMBODIMENTS

The preferred embodiments of this invention are explained below with reference to the figures. The scale of the components and the layers differs from that of the actual embodiment in FIGS. 1-21, in order for the drawings of each layer and component to be recognizable.

First Embodiment

Figure 1:
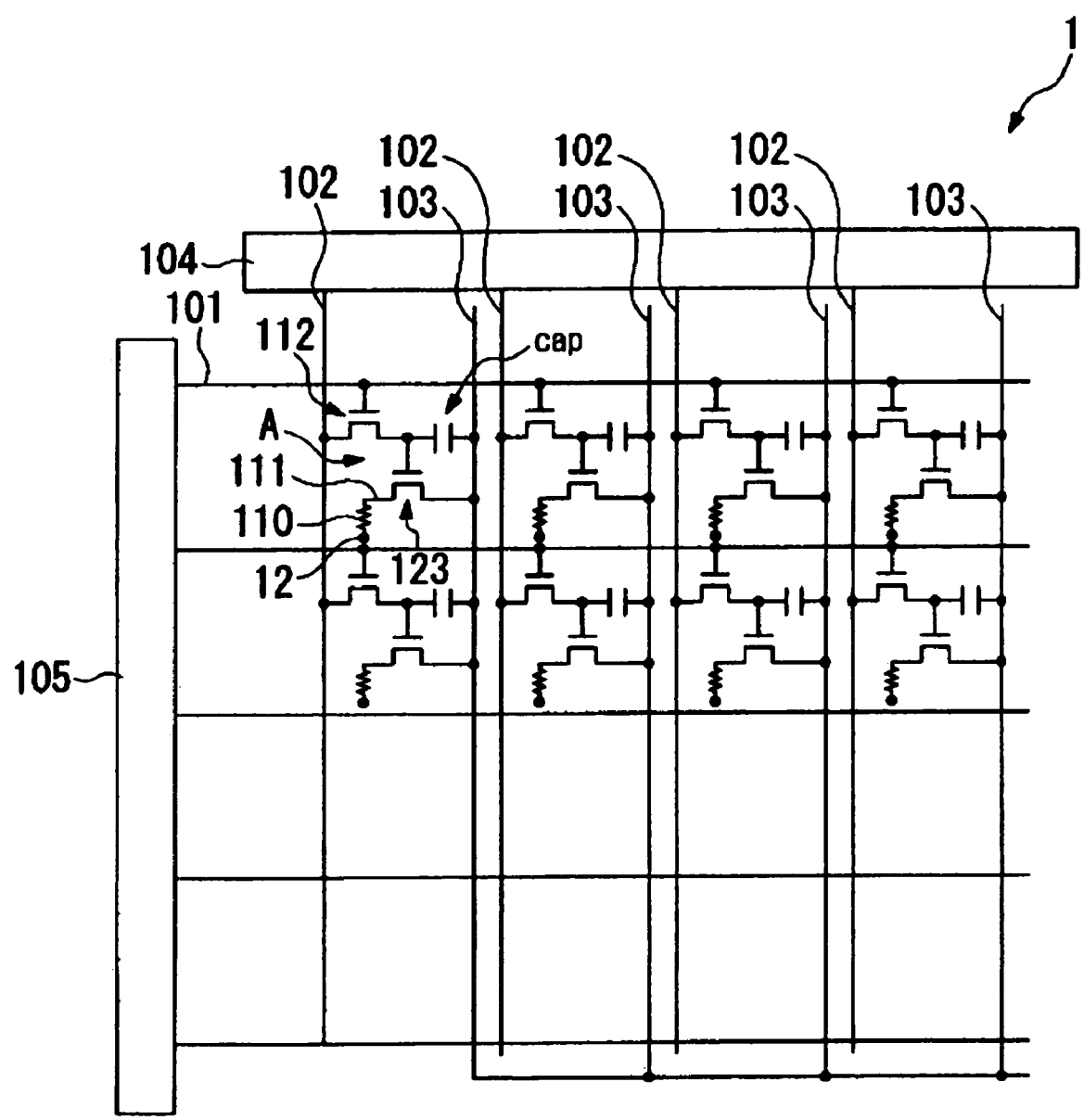
FIG. 1 is a plan schematic view illustrating the wiring structure for the display device for the first embodiment of this invention.

FIG. 1 shows a circuit diagram of the wiring structure of an organic EL device, which is the first display device of this embodiment, and FIGS. 2(a) and (b) show a plan view and a sectional view of the display device of this embodiment.

As shown in FIG. 1, a display device 1 in this embodiment has multiple scanning lines 101, multiple signal lines 102, which intersect with and extend past the scanning lines 101, multiple power lines 103 which extend parallel to signal lines 102, a circuit which includes these lines, and pixel regions A, established around the intersections of the scanning lines 101 and the signal lines 102.

A data side drive circuit 104, containing shift registers, level shifters, video lines, analog switches and other components, is connected to the signal lines 102. Also, a lateral scanning drive circuit 105, containing shift registers, level shifters and other components, is connected to the scanning lines 101.

A thin film transistor (TFT) 112 for switching, where the scanning signal is supplied to a gate electrode via the scanning line 101, the storage capacitor (cap) which holds the pixel signal supplied from signal line 102 via the switching TFT 112, the drive TFT 123 for driving, where the pixel signal held in the storage capacitor (cap) is supplied to the gate electrode, a pixel electrode 111 receiving the driving current from a power line 103 when electrically connected to the power line 103 through the TFT 123 for driving, and the functional layer 110 lying between this pixel electrode 111 and a negative electrode (opposing electrode) 12 are provided for each pixel region A. The EL element, e.g. an organic EL element, is composed of the above electrode 111, an opposing electrode 12 and the functional layer 110.

Due to this structure, when the switching TFT 112 is turned ON by driving the scanning line 101, the electric potential of signal line 102 at this time is stored in the storage capacitor cap; the state of the storage capacitor cap determines the ON/OFF condition of the drive TFT 123. Electric current flows through the channel of the drive TFT 123 from the power line 103 to the pixel electrode 111, and, in turn, through the functional layer 110 to the negative electrode 12. The functional layer 110 is illuminated in accordance with the flow rate of current flowing through it.

Next, a specific sample of the organic EL device, which is a display device of this embodiment, is described in FIGS. 2(a) and 2(b). FIG. 2(b) is sectional view A-B of FIG. 2(a). As shown in these figures, the display device 1 of this embodiment comprises a substrate 2 made of a transparent material such as glass and an emissive element component 11 comprised of emissive elements arranged in a matrix shape on the substrate 2. Each emissive element is comprised of a positive electrode, a functional layer and a negative electrode, and "functional layer" comprises a hole injection/transfer layer, a light-emitting layer, an electron injection/transfer layer, and other components.

The substrate 2 is a transparent substrate such as glass and is divided into a viewing area 2a in the center of the substrate 2, and a non-viewing area 2b on the edge of the substrate 2 outside the viewing area 2a.

The viewing area 2a is a region formed by emissive elements arranged in a matrix shape and is also called the "effective viewing area". Also, the non-viewing area 2b is formed on the outer side of the display area. A dummy viewing area 2d is formed in the non-viewing area 2b next to the viewing area 2a.

Figure 2:
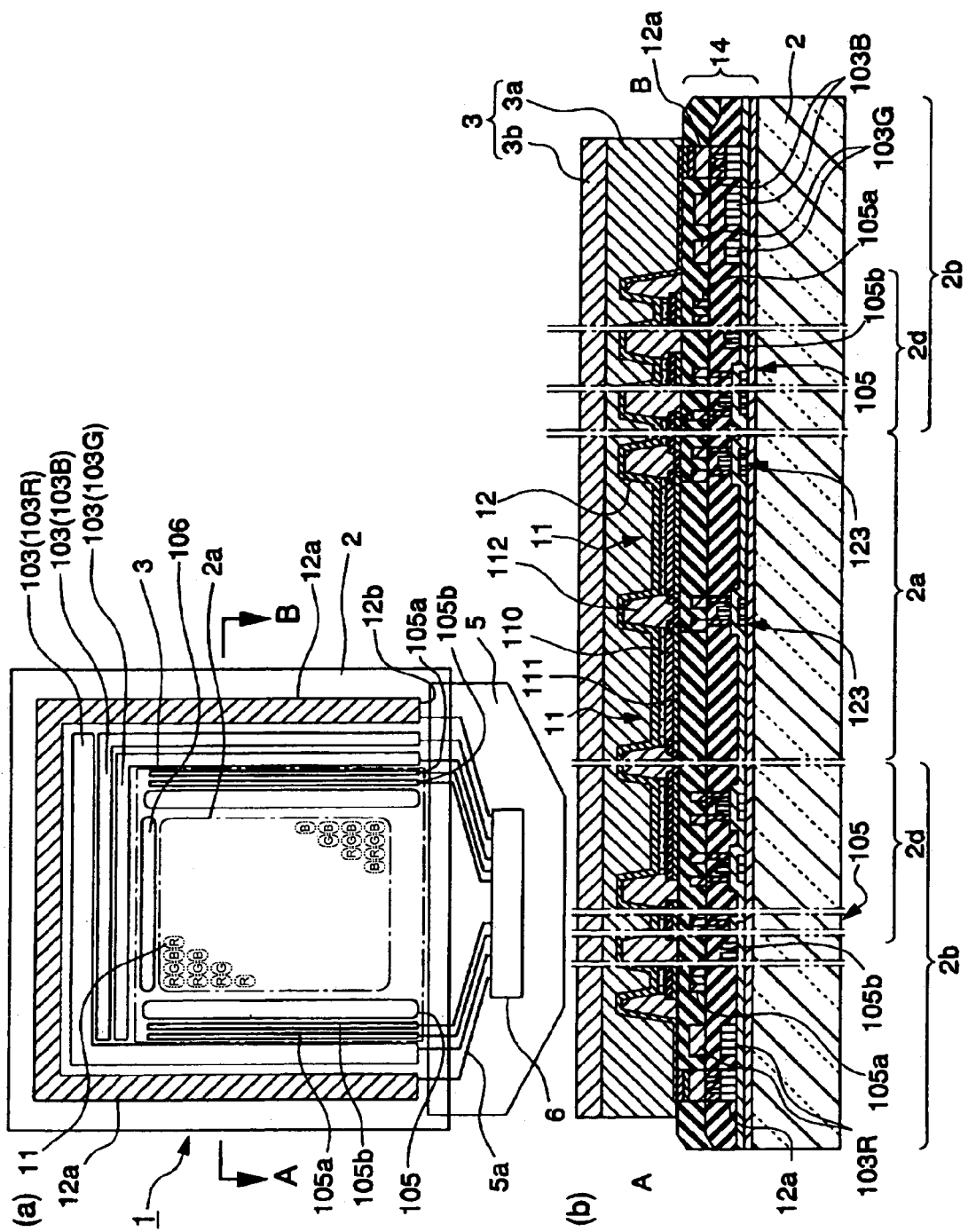
FIG. 2(a) is a plan view and FIG. 2(b) is a sectional view illustrating the display device for the first embodiment of this invention.

As shown in FIG. 2.(b), a circuit element member 14 is located between the emissive element component 11 and the substrate 2, and contains the scanning lines, signal lines, the storage capacitors, the switching TFT, the drive TFT 123 and other components.

One end of the negative electrode 12 is connected to the negative electrode wire 12a on the substrate 2, and one end 12b of this wire is in contact with a wire 5a on a flexible plate 5. The wire 5a is also connected to a drive IC6 (drive circuit) contained in the flexible plate 5.

As shown in FIG. 2(a) and FIG. 2(b) the power lines 103 (103R, 103G, 103B) are on the non-viewing area 2b of the circuit element member 14.

The lateral scanning drive circuits 105 and 105 are on both sides of viewing area 2a, as shown in FIG. 2(a). These lateral scanning drive circuits 105 and 105 are on the underside of the dummy viewing area 2d in the circuit element member 14. A drive circuit control signal line 105a and a drive circuit power line 105b, connected to lateral scanning drive circuits 105 and 105, are also in the circuit element member 14.

A test circuit 106 is on the upper side of the viewing area 2a (upper part in the figure) in FIG. 2(a). The test circuit 106 allows testing of quality and checking for defects of the display device during manufacture and at the time of shipping.

As also shown in FIG. 2(b), a sealing member 3 is contained on the emissive element component 11. This sealing member 3 comprises a sealing resin 3a of thermosetting resin or UV curing resin applied to the negative electrode 12 and the sealing substrate 3b on the sealing resin 3a. The sealing resin 3a preferably does not release gas, solvent or other substances during hardening.

This sealing member 3 is formed so as to cover at least the extent of the negative electrode 12. The sealing member 3 prevents incursion of water or oxygen into the negative electrode 12 and the light-emitting layer, and thereby, prevents oxidation of the negative electrode 12 and a light-emitting layer.

The sealing substrate 3b is bonded to and protects the sealing resin 3a. It is preferably a glass plate, metal plate or resin plate.

As will be explained later, a can sealing type of sealing substrate is preferable. A getter material may be placed within a concavity to absorb oxygen and prevent oxidation within the sealed interior.

Figure 3:
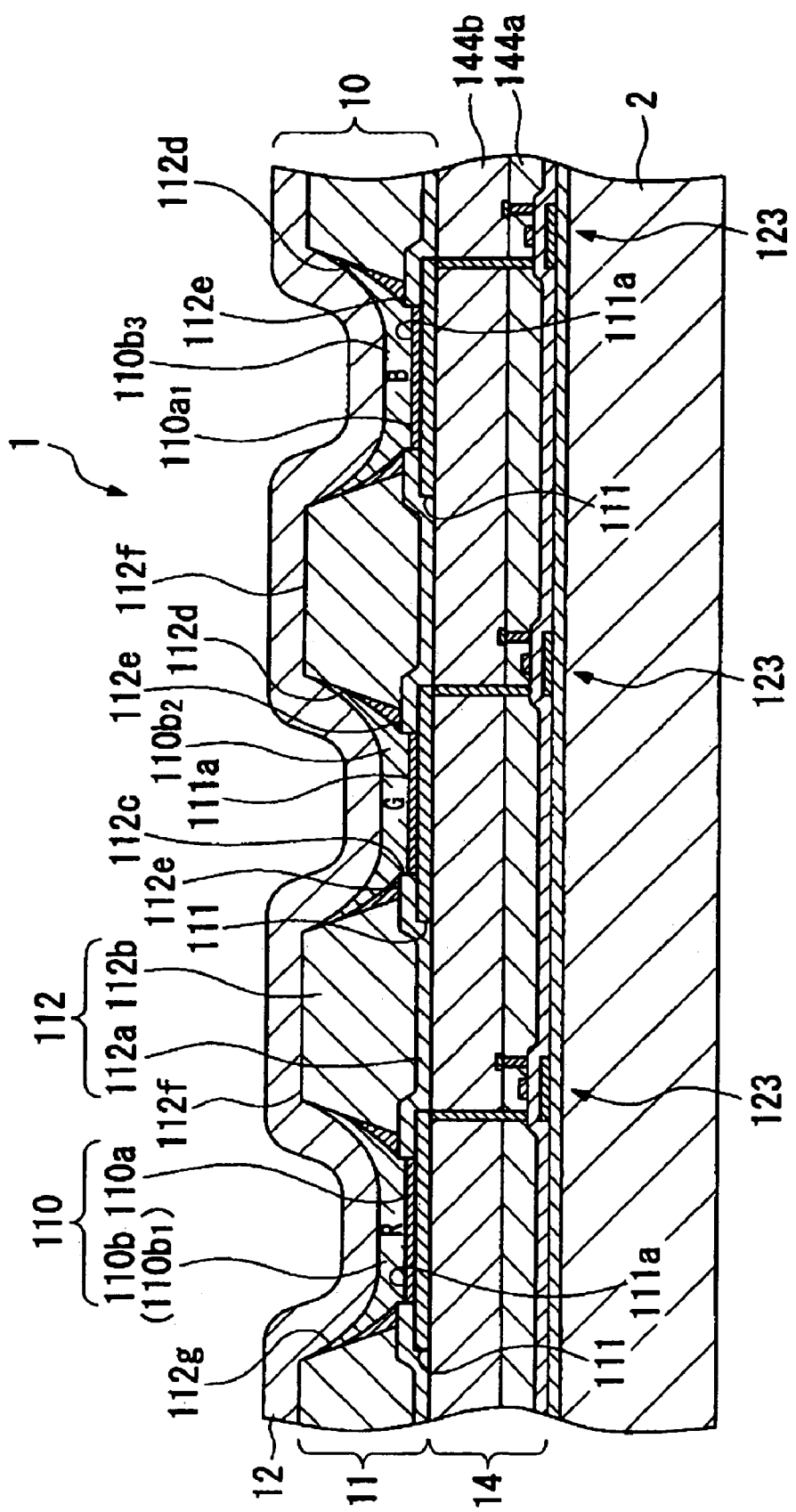
FIG. 3 is a sectional view illustrating the main components of the display device for the first embodiment of this invention.

Next, FIG. 3 contains an expanded view of the emissive element in the display device; the cross-sectional view of the structure of the viewing area has been especially expanded. Three pixel regions A are illustrated in FIG. 3.

This display device 1 comprises the substrate 2, the circuit element member 14, including and the TFT and other circuits on the substrate 2, the pixel electrode (positive electrode) 111 formed on the circuit element member 14, and the emissive element component 11, which includes the functional layer 110 including hole injection/transfer layer 110a and light-emitting layer 110b, and the negative electrode 12. The functional layer may include an electron injection/transfer layer formed on the light-emitting layer. The positive electrode 111, the hole injection/transfer layer 110a, the light-emitting layer 110b and the negative electrode 12 can constitute the organic EL device.

In this display device 1, light is released from the functional layer 110 to the substrate 2. While it passes through the circuit element member 14 and the substrate 2 and exits toward the underside of the substrate (the observer's side), light released on the opposite side of the substrate 2 from the functional layer 110 is reflected from the negative electrode 12, passing through the circuit element member 14 and the substrate 2 and exiting from the underside of the substrate 2 (observer's side).

As shown in FIG. 3, the emissive element component 11 is mainly comprised of the functional layer 110, which is individually disposed in layers upon a plurality of pixel electrodes 111 as dots and a bank 112, which is provided between each of pixel electrodes 111 and the functional layer 110 as a means of partitioning the functional layer 110. The negative electrode 12 is disposed on the functional layer 110.

The emissive element 11 (e.g., an organic EL device) is comprised of these pixel electrodes 111 the functional layer 110 and the negative electrode 12.

Here, the pixel electrode 111, which is made of indium tin oxide (ITO), for example, is formed by patterning it in an approximately, rectangular shape as seen from the planar direction. The thickness of the pixel electrode 111 is preferably in the range of 50 to 200 nm, for example, with about 150 nm being particularly desirable. The bank 112 is provided between these pixel electrode 111 dots.

As shown in FIG. 3, the bank 112 is comprised of an inorganic bank layer 112a (first bank layer), which is located on the side nearer the substrate 2, and an organic bank layer 112b (second bank layer), which is deposited thereupon and apart from the substrate 2.

The inorganic bank layer and organic bank layer (112a, 112b) are formed such that they ride up onto the edge of the pixel electrode 111. The perimeter of the pixel electrode 11.1 and the inorganic bank, layer 112a are arranged overlapping together on a plane. The organic bank layer 112b is disposed the same way, such that, in a plan view, it overlaps a portion of the pixel electrode 111. The inorganic bank layer 112a is formed farther toward the center of the center of the pixel electrode 111 than the organic bank layer 112b.

The inorganic bank layer 112a is preferably made of inorganic materials, e.g., quartz or titanium dioxide. The thickness of the inorganic bank layer 112a is preferably in the range of 50 to 200 nm, for example, with about 150 nm being particularly desirable. If it is less than 50 nm, the inorganic bank layer 112a becomes thinner than the hole injection/transfer layer, described below, and this is not preferable since it poses problems in creating a flat hole injection/transfer layer. If the thickness is above 200 nm, there is an excessive step from the lower opening 122c, and this is not preferable since it poses problems in creating a flat light-emitting layer, described below, on the hole injection/transfer layer.

The organic bank layer 112b is composed of resist, e.g. acrylic resin or polyimide resin that is heat-resistant and insoluble. The thickness of the organic bank layer 112b is preferably 0.1 to 3.5 micrometers, with 2 micrometers being particularly desirable. If it is less than 0.1 micrometers, the thickness of the organic bank layer 112b is less than the total thickness of the hole injection/transfer layer and light-emitting layer, described below, and this is not preferable because there is a concern of the light-emitting layer spilling from the upper opening 112d. If the thickness is greater than 3.5 micrometers, there is a large step due to the upper opening 112d, and this is not desirable because it is difficult to create step coverage of the negative electrode 12 on the organic bank layer 112b. Also, it is preferable for the thickness of the organic bank layer 112b to be at least 2 micrometers, to provide greater insulation against the drive TFT 123.

The bank 112 is formed with lyophilic regions and lyophobic regions.

The lyophilic regions are the first layer 112e of the inorganic bank layer 112a and the electrode face 111a of the pixel electrode 111. These regions are surface-treated to be lyophilic by plasma treatment using oxygen as the treatment gas. The lyophobic regions are the wall face of a upper opening 112d and a upper face 112f of the organic bank layer 112. These regions are fluorinated (treated to be lyophobic) at the surface with plasma treatment using tetrafluoromethane as the treatment gas.

Next, as shown in FIG. 3, the functional layer 110 is composed of the hole injection/transfer layer 110a, which is formed on the pixel electrode 111, and the light-emitting layer 110b, which is formed next to and upon the hole injection/transfer layer 110a. The electron transfer layer can be formed adjacent to the light-emitting layer 110b.

The hole injection/transfer layer 110a has the functions of transporting holes within its own interior and of injecting holes into the light-emitting layer 110b. Establishing this hole injection/transfer layer 110a between the pixel electrode 111 and the light-emitting layer 110b improves element characteristics such as emissive efficiency and life of the light-emitting layer 110b. Also, the holes in the light-emitting layer 110b injected from the hole injection/transfer layer 110a recombine with the electrons injected from the negative electrode 12, producing light.

The hole injection/transfer layer 110a has a flat component 110a1 formed on a electrode face 111a in a lower opening 112c. In some cases, this is formed on the edge on a first layer 112e of the inorganic bank layer 112a located in the upper opening 112d. This flat component 110a1 has a regular thickness of 50-70 nm, for example.

Also, when the flat component is formed on the edge, the edge lies on the first layer 112e and is sealed to the wall face of the upper opening 112d, i.e. to the organic bank layer 112b. Also, the edge is thinner on the side near the electrode face 111a and increases in thickness with distance away from the electrode face 11a, such that it is thickest near the wall face of the lower opening 112d.

The light-emitting layer 110b is formed on the flat component 110a1 of the hole injection/transfer layer 110a and the bank, and the thickness above the flat component 110a1 is in the range 50-80 nm, for example.

There are three kinds of light-emitting layers 110b, a red light-emitting layer 110b1 that emits red (R), a green light-emitting layer 110b2 that emits green (G), and a blue light-emitting layer 110b3 that emits blue (B). Light-emitting layers 110b1-110b3 are arranged in a stripe layout.

Since the inorganic bank layer 112a protrudes farther toward the center of the pixel electrode 111 than the organic bank layer 112b, it is possible to trim the shape of the bonded portion between the flat component 110a1 and the pixel electrode 111 with the inorganic bank layer 112a. This suppresses scatter in luminous intensity among the light-emitting layers 110b.

Since the electrode face 111a of the pixel electrode 111 and the first layer 112e of the inorganic bank layer are lyophilic, the functional layer 110 is uniformly sealed to the pixel electrode-111 and to the inorganic bank layer 112a, such that the functional layer 110 on the inorganic bank layer 112a is not extremely thin. This prevents a short circuit between the pixel electrode 111 and the negative electrode 12.

Since the upper surface 112f of the organic bank layer 112b and the wall face of the upper opening 112d are lyophobic, the seal between the functional layer 110 and the organic bank layer 112b is low, and the functional layer 110 does not spill through the opening 112g.

As materials for the hole injection/transfer layer, a mixture of polytheophene semiconductors such as polyethylene dioxythiophene (PEDT) and materials such as polystyrene sulphonic acid can be used.

Materials for the light-emitting layer 110b are, for example, [CHEMICAL1]-[CHEMICAL5], or polyfluorene derivatives, polyphenylene derivatives, polyvinyl carbazole, and polytheophene derivatives, Also available for use is any of the aforementioned polymers by dopinga perylene dye, a coumarin dye and a rhodamine dye, such as rubrene, perylene, 9, 10-diphenyl anthracene, tetraphenyl butadiene, Nile red, coumarin 6 or quinacridone.

CHEMICAL 1

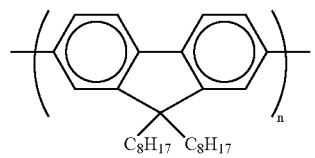

CHEMICAL 2

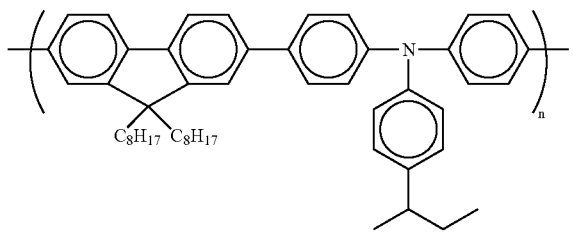

CHEMICAL 3

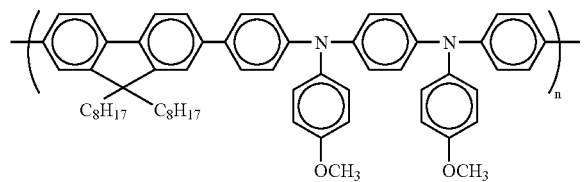

CHEMICAL 4

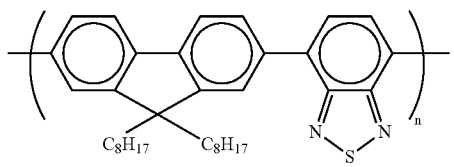

CHEMICAL 5

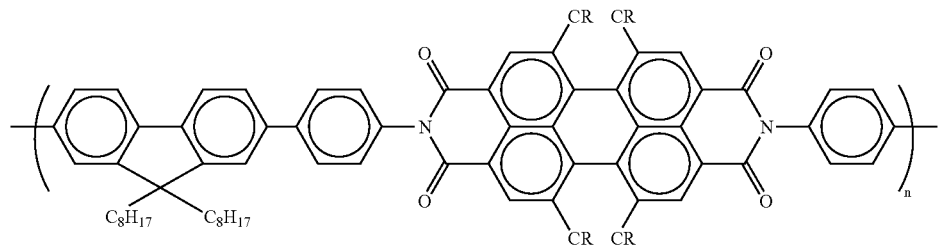

Next, the negative electrode 12 is formed throughout the entire surface of the emissive element 11, forms a pair with the pixel electrode 111 and performs the role of providing current to the functional layer 110. This negative electrode 12 is formed by multi layers such as a calcium layer and aluminum layer. In this case, it is preferable to establish a layer having a low work function on the negative electrode near the light-emitting layer. In this embodiment, particularly, the negative electrode 12 is in direct contact with and has the role of injecting electrons into the light-emitting layer 110*b*. Lithium fluoride is deposited between the light-emitting layer 110*b* and the negative electrode 12 in some cases because it increases the efficiency of the light-emitting layer for some materials.

Lithium fluoride is not the only material with this property for the red and green light-emitting layers 110*b*1 and 110*b*2; other materials can also be used. In this case, the blue light-emitting layer 110*b*3 is the only layer composed of lithium fluoride, and the other red and green light-emitting layers 110*b*1 and 110*b*2 may be manufactured of something else. This material may be calcium.

The lithium fluoride is preferably of a thickness range of 2-5 nm, for example, with about 2 nm being particularly desirable. Calcium is preferably of a thickness range of 2-50 nm, with about 20 nm being particularly desirable.

The aluminum for forming the negative electrode 12 reflects the light emitted by the light-emitting layer 110*b* toward the substrate 2, so the reflective component preferably includes an Al film, an Ag film, an Al—Ag film, or other. It is preferable that the thickness is in the range 100-1000 nm, for example, with about 200 nm being particularly desirable.

A layer of SiO, $SiO_2$, SiN or other components can also be deposited over the aluminum to prevent oxidation.

The method for manufacturing the organic EL device shown here will be explained below with reference to the figures.

The method for manufacturing the display device 1 of this embodiment comprises steps, for example, (1) bank component formation process, (2) plasma treatment process, (3) hole injection/transfer layer formation process, (4) light-emitting layer formation process, (5) opposing electrode formation process, and (6) sealing process. The manufacturing method is not limited to the steps given above; some may be deleted and other processes may be added as necessary.

(1) Bank Component Formation Process

The process for bank formation is a process of forming the bank 112 at a fixed location on the substrate 2. The bank 112 is formed of the inorganic bank layer 112*a* as the first bank layer and the organic bank layer 112*b* as the second bank layer. The formation method is explained below.

(1)-((1)) Formation of Inorganic Bank Layer

Figure 4:
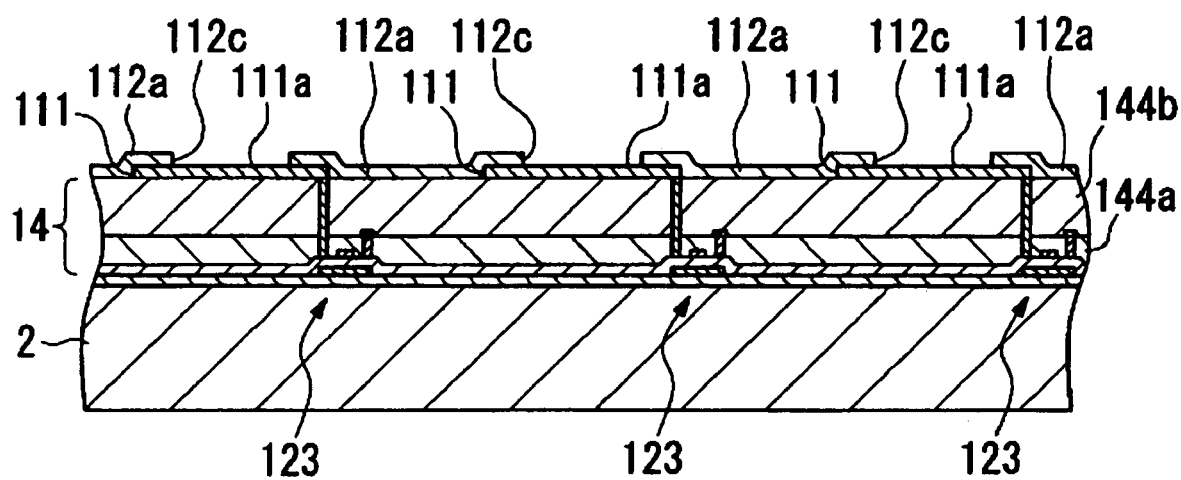
FIG. 4 is a process drawing describing the method of manufacturing the display device for the first embodiment of this invention.

First, as shown in FIG. 4, the inorganic bank layer 112*a* is formed at a fixed location on the substrate. The location where the inorganic bank layer 112*a* is formed is on the second inter-layer insulating film 144*b* and the electrode (here, the pixel electrode) 111. The structure in FIG. 4 is based on FIG. 1 and FIG. 2. The second inter-layer insulating film 144*b* is formed on the circuit element member 14, in which are disposed TFT, scanning lines, signal lines and other components.

The inorganic bank layer 112*a* can be made of inorganic film materials, e.g., $SiO_2$ or $TiO_2$. The inorganic bank layer 112*a* with using these materials can be formed by chemical vapor deposition (CVD), coating, sputtering, vapor deposition or other methods.

The thickness of the inorganic bank layer 112*a* is preferably in the range of 50 to 200 nm, with about 150 nm being particularly desirable.

The inorganic bank layer 112*a* is formed by depositing inorganic film throughout the entire surfaces of the first inter-layer insulating film 144*a* and of the pixel electrode 111, and after that, photo-lithographic patterning is used to create the inorganic bank layer 112*a* with openings.

The openings allow access to the location where the electrode face 111*a* of the pixel electrode 111 is formed, and corresponds to the lower opening 112*c*, as shown in FIG. 4.

During manufacturing, the inorganic bank layer 112*a* is formed so as to overlap with the edge of the pixel electrode 111. As shown in FIG. 4, inorganic bank layer 112*a* is formed in a manner that its edge is overlapped by the edge of pixel electrode 111, so as to control the emissive regions of functional layer 110.

(1)-((2)) Formation of Organic Bank Layer 112*b*

Next, the organic bank layer 112*b* is formed as the second bank layer.

Figure 5:
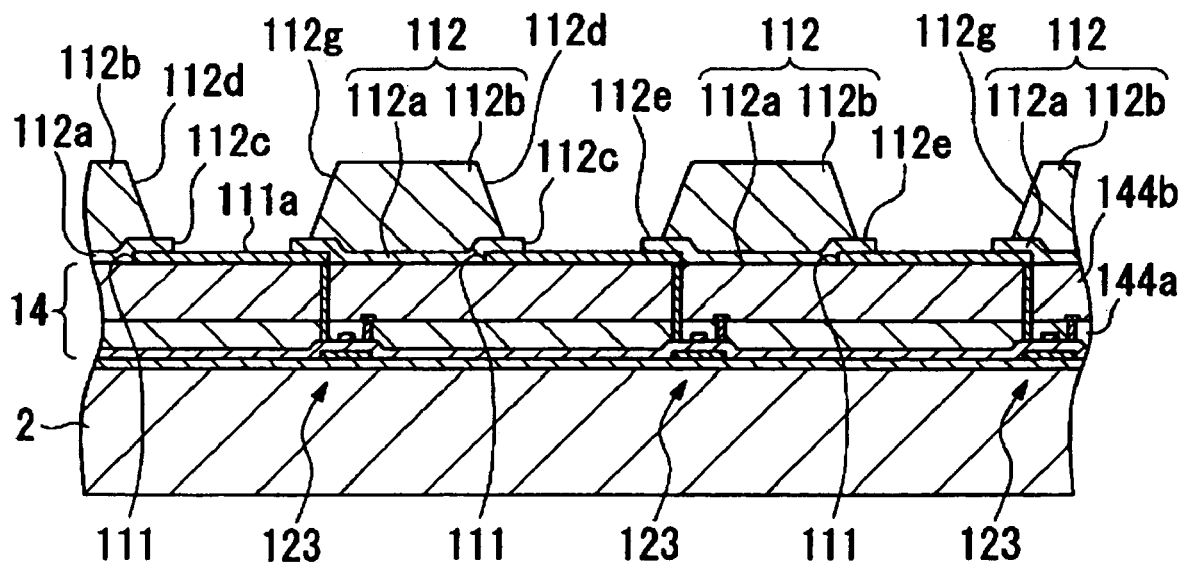
FIG. 5 is a process drawing describing the method of manufacturing the display device for the first embodiment of this invention.

As shown in FIG. 5, the organic bank layer 112*b* is deposited on the inorganic bank layer 112*a*. Heat-resistant and insoluble materials, e.g., acrylic resin or polyimide resin, are employed for the organic bank layer 112*b*. Photolithographic patterning is used with these materials to create the organic bank layer 112*b*. During patterning, the upper opening 112*d* is formed on the organic bank layer 112*b*.

The upper opening 112*d* is formed in a location corresponding to that of the electrode face 111*a* and the lower opening 112*c*.

As shown in FIG. 5, it is preferable for the upper opening 112*d* to be formed over a wider extent than the lower opening 112*c* formed on the inorganic bank layer 112*a*. It is also desirable for the organic bank layer 112*b* to have a tapered shape, to be less wide at its lowest surface than the pixel electrode 111, and to be about the same width as pixel electrode 111 at its top face. This will allow the first layer 112*e* surrounding the lower opening 112*c* of the inorganic bank layer 112*a* to protrude farther toward the center of the pixel electrode 111 than the organic bank layer 112*b*.

By forming the upper opening 112*d* on the organic bank layer 112*b* such that it communicates with the lower opening 112*c* on the inorganic bank layer 112*a*, an opening 112*g* is formed which passes through both the inorganic bank layer 112*a* and the organic bank layer 112*b*.

The thickness of this organic bank layer 112*b* is preferably 0.1 to 3.5 micrometers, for example, with 2 micrometers being particularly desirable. The reasons for this scale are explained below.

It is not preferable for the thickness of the organic bank layer 112*b* to be less than 0.1 micrometers, because it is then less than the total thickness of the hole injection/transfer layer and light-emitting layer, described below, and this raises concern about the light-emitting layer 110*b* spilling from the upper opening 112*d*. If the thickness is greater than 3.5 micrometers, there is a large step due to the upper opening 112*d*, and this is not desirable because it is difficult to create step coverage of the negative electrode 12 in the upper opening 112*d*. Also, it is preferable for the thickness of the organic bank layer 112*b* to be at least 2 micrometers, to provide greater insulation between the negative electrode 12 and the drive TFT 123.

(2) Plasma Treatment Process

Next, plasma treatment process is carried out with the objectives of activating the surface of the pixel electrode 111 and of surface-treatment of the bank 112. Of particular importance is the goal of cleaning the pixel electrode 111 (ITO), in the activating process in the plasma treatment process, and another main purpose is adjustment of the work function. In addition, treatment is performed to make the surface of the pixel electrode 111 lyophilic and to make the surface of the bank 112 lyophobic.

This plasma treatment process can be broadly classified into the following four steps, e.g. ((1)) Pre-heat, ((2)) Activation treatment process (process to establish lyophilic properties), ((3)) Lyophobic processing, and ((4)) Cooling. The process is not limited to the steps given above; some may be deleted and other processes may be added as necessary.

Pre-heating process is performed in the preheat chamber 51. Here, the substrate including the bank 112 is heated to a certain temperature.

To heat the substrate 2, it is placed on the stage in the preheat chamber 51, to which, for example, a heater is attached. The heater heats the entire stage including the substrate 2. It is also possible to adopt other methods.

The substrate 2 is heated in the preheat chamber 51 to a temperature of, e.g., 70° C.-80° C. This is the processing temperature for the plasma treatment, the next stage, and the goal of this step is to pre-heat the substrate 2 as suitable for the next process to eliminate fluctuation in the temperature of the substrate 2.

If the pre-heat process was not employed, the substrate 2 would have to be heated from room temperature to a certain temperature as described above. The temperature would then be continually varying from the beginning of the plasma treatment process to the end. Fluctuating substrate temperatures during plasma treatment would allow the potential for unevenness in the properties. That is why pre-heating is carried out, to maintain even processing conditions to obtain uniform properties.

When the process to confer lyophilic or lyophobic properties is carried out while the substrate 2 is on the sampling stage in the first and second plasma treatment chambers 52 and 53 in the plasma treatment process, it is preferable for the pre-heat temperature to be set approximately to that of the sampling stage 56 where the process to confer lyophilic or lyophobic properties is carried out in succession.

Therefore, by initially pre-heating the substrate 2 to a temperature of, e.g., 70° C.-80° C., to which the sampling stage in the first and second plasma treatment chambers 52 and 53 is raised, it will be possible to maintain the plasma treatment conditions constant just after the beginning of the process and just before the end of the process, even while multiple, successive substrates are subjected to plasma treatment. This will create consistent surface processing conditions among the substrates 2, establishing uniformity in the wettability of the bank 112 constitution, and allowing manufacture of display device with consistent quality.

Also, by pre-heating the substrate 2, the time necessary for the subsequent plasma treatment processes is shortened.

(2)-((2)) Activation Process

Next, the activation treatment is carried out in the first plasma treatment chamber 52. The activation treatment includes adjustment of the work function in the pixel electrode 111, control, cleaning of the pixel electrode surface and conferring of lyophilic properties on the pixel electrode surface.

Figure 7:
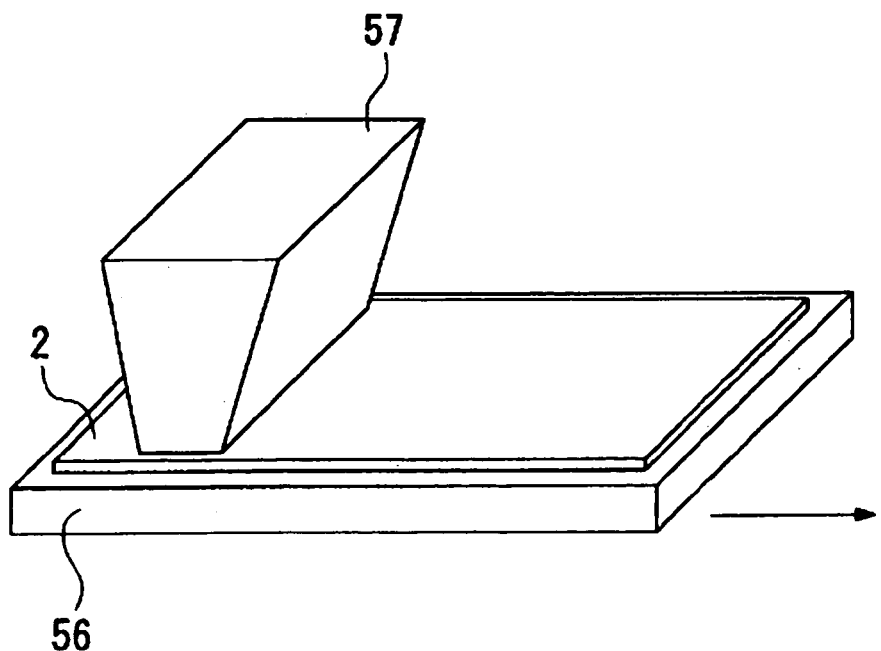
FIG. 7 is a schematic view illustrating the interior structure of the plasma treatment chamber for the first embodiment of this invention.

Plasma treatment in the atmosphere using oxygen as the treatment gas ($O_2$ plasma treatment) is performed to confer lyophilic properties. FIG. 7 provides a schematic view of the first plasma treatment. As shown in FIG. 7, the substrate 2 including the bank 112 is placed on the sampling stage 56, which includes a heater, and the plasma discharge electrode 57 is positioned above and opposite the substrate 2 at a gap of 0.5-2 mm. While the sampling stage 56 heats the substrate 2, it is moved at a certain transfer speed in the direction shown by the arrow in the figure, and simultaneously, the substrate 2 is irradiated with the oxygen plasma.

The conditions for $O_2$ plasma treatment are, for example, a plasma power of 100-800 kW, an Oxygen gas flow rate of 50-100 ml/min, a substrate transfer speed of 0.5-10 mm/sec and a substrate temperature of 70° C.-90° C. Heating with the sampling stage 56 is mainly carried out for the purpose of maintaining the pre-heat temperature of the substrate 2.

Figure 8:
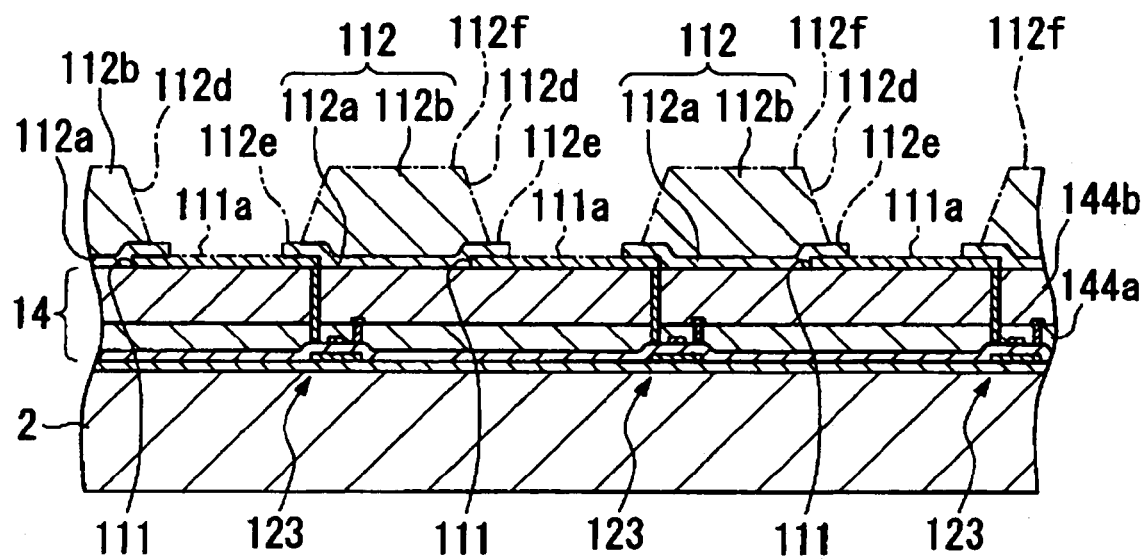
FIG. 8 is a process drawing describing the method of manufacturing the display device for the first embodiment of this invention.

By this $O_2$ plasma treatment, as shown in FIG. 8, lyophilic properties are conferred on the electrode face 111a of the pixel electrode 111, on the first layer 112e of the inorganic bank layer 112a and on the wall face and the upper face 112f of the upper opening 112d of the organic bank layer 112b. This process comprises introducing hydroxyl groups to each of these faces to confer lyophilic properties.

Figure 9:
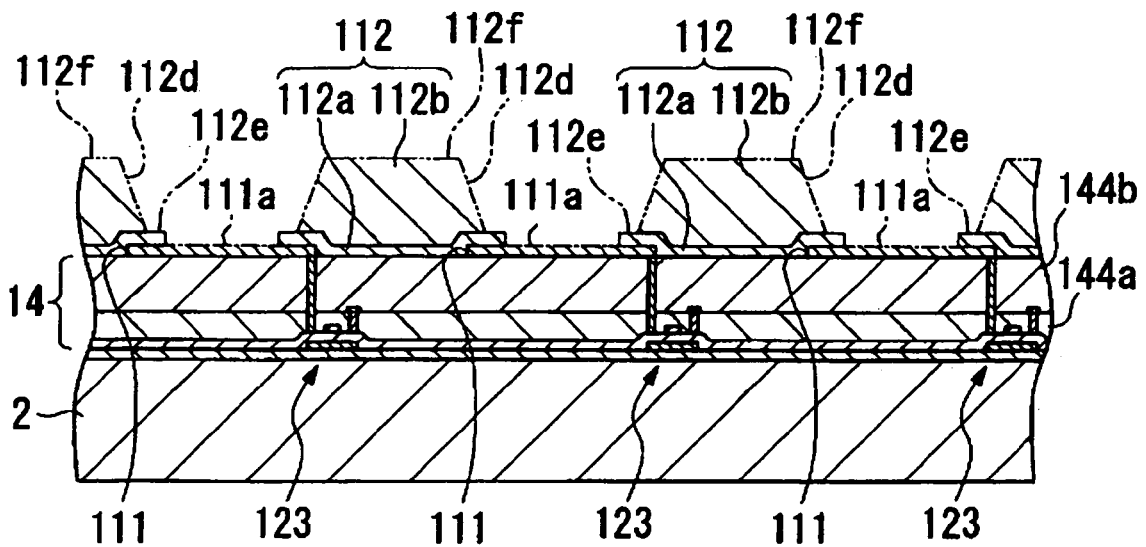
FIG. 9 is a process drawing describing the method of manufacturing the display device for the first embodiment of this invention.

FIG. 9 shows locations treated with the process to confer lyophilic properties with dot-dash lines.

Not only does this $O_2$ plasma treatment confer lyophilic properties, it also cleans the ITO, the pixel electrode, and adjusts the work function, as described above.

(2)-((3)) Lyophilic Treatment

Next, in the second plasma treatment chamber 53, plasma treatment in the atmosphere using tetrafluoromethane as the treatment gas ($CF_4$ plasma treatment) is performed as the process to confer lyophobic properties. The internal structure of the second plasma treatment chamber 53 is the same as that of the first plasma treatment chamber 52, as shown in FIG. 7. In other words, while the substrate 2 is heated by the sampling stage, it is moved together with the sampling stage at a certain transfer speed and irradiated with the tetrafluoromethane plasma (carbon tetrafluoride).

The conditions for $CF_4$ plasma treatment are, for example, a plasma power of 100-800 kW, a tetrafluoromethane gas flow rate of 50-100 ml/min, a substrate transfer speed of 0.5-10 mm/sec and a substrate temperature of 70° C.-90° C. Heating on the sampling stage is mainly carried out for the purpose of maintaining the pre-heat temperature of the substrate 2, in the first plasma treatment chamber 52.

Also, tetrafluoromethane (carbon tetrafluoride) is not the only gas, which can be used for this treatment; other fluorocarbon gases can also be used.

As shown in FIG. 9, by $CF_4$ plasma treatment, the wall surface of the upper opening 112d and the upper face 112f of the organic bank layer are made lyophobic. This lyophobic treatment consists of introducing fluorine group to each of these faces. The dot-dash lines in FIG. 9 show the lyophobic locations. The acrylic resin, polyamide resin, or other organic compounds making up the organic bank layer 112b are easily made lyophobic by irradiating them with fluorocarbon plasma. They also have the characteristic that pre-treatment with $O_2$ plasma makes them more receptive to fluoridation. This is particularly effective for this embodiment.

Also, the electrode face 111a of the pixel electrode 111 and the first layer 112e of the inorganic bank layer 112a are somewhat affected by the $CF_4$ plasma treatment, but their wettability is not affected. FIG. 9 shows the lyophilic regions with dot-dash lines.

(2)-((4)) Cooling Process

Next, for the cooling process, the substrate 2, which has been heated for the plasma treatment, is cooled to the managed temperature in the cooling chamber 54. The purpose for this is to bring it to the managed temperature for the next stage, the ink-jet process (droplet ejection process).

The cooling chamber 54 has a plate for the substrate 2 to be placed thereon. The internal structure of the plate contains a water-cooling apparatus so that the plate cools the substrate 2.

Also, by cooling the substrate 2 after plasma treatment to room temperature or to a certain temperature (e.g., the managed temperature for ink-jet process), the temperature of the substrate 2 is made constant in the hole injection/transfer layer formation process, and it is possible to carry out the next process at a non-fluctuating, uniform temperature of the substrate 2. Thus, by adding this cooling process, the material ejected by the ejection apparatus e.g. an ink-jet method is formed in a uniform way. For example, when the first solution including the material for forming the hole injection/transfer layer is ejected, it is possible to continuously eject a constant volume of the first solution, allowing formation of a uniform hole injection/transfer layer.

In the above plasma treatment, by alternating between the $O_2$ plasma treatment process and the $CF_4$ plasma treatment process for the organic bank layer 112b and the inorganic bank layer 112a, whose material properties differ, it is easy to establish both types of lyophilic and lyophobic regions in the bank 112.

(3) Hole Injection/Transfer Layer Formation Process

Next, the hole injection/transfer layer is formed on the electrode (here, pixel electrode 111) by the emissive element formation process.

In the hole injection/transfer layer formation process, by using, for example, an ink-jet apparatus as the droplet ejection method, the first solution (constituent) including the hole injection/transfer layer material (e.g., PEDT and its dispersion medium, water) is ejected onto the electrode face 111a. Drying and heating processes are carried out after that, and the hole injection/transfer layer 110a is formed on the pixel electrode 111 and on the inorganic bank layer 112a. The inorganic bank layer 112a with the hole injection/transfer layer 110a formed is called "a first deposited layer" 112e.

The atmosphere above this hole injection/transfer layer formation process and above the subsequent processes preferably do not include any water or oxygen. The atmosphere is preferably an inert gas, e.g. nitrogen or argon.

Sometimes, no hole injection/transfer layer 110a is formed on the first layer 112e. In other words, in some embodiments, a hole injection/transfer layer may be formed only on the pixel electrode 111.

Figure 10:
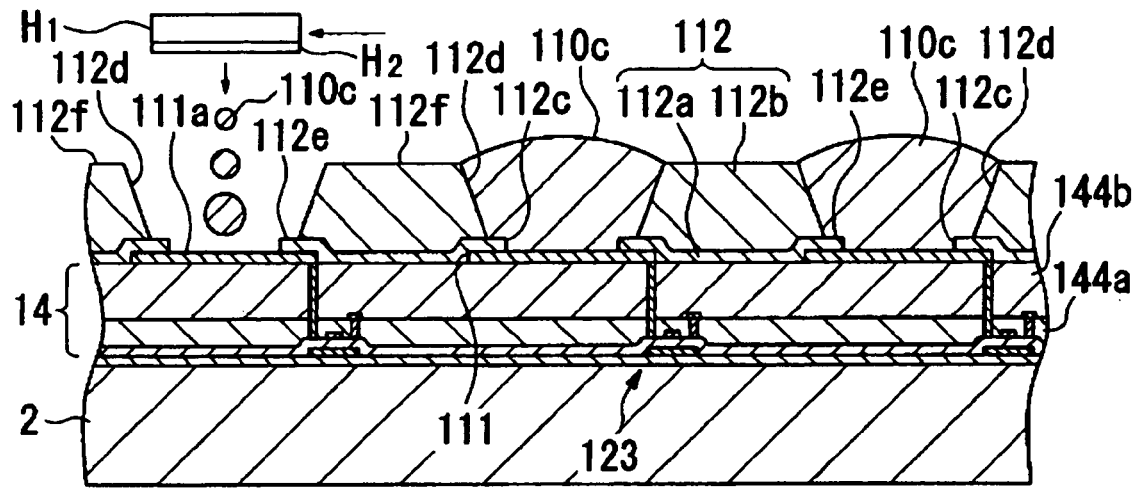
FIG. 10 is a process drawing describing the method of manufacturing the display device for the first embodiment of this invention.

The ink-jet manufacturing method is the following. As shown in FIG. 10, the first solution including the material for forming the hole injection/transfer layer is ejected from multiple nozzles formed on the ink-jet head H1. The figure shows each pixel being filled with the constituents by scanning the ink-jet head, but it is also possible to make these additions by scanning the substrate 2. Another possible method is to move the ink-jet head and the substrate 2 relative to each other and add the constituents. The above points also apply to subsequent processes employing the ink-jet head.

The ejection by the ink-jet head is as follows. The ejection nozzles H2 formed on the ink-jet head H1 are positioned opposite the electrode face 111a and the first solution is ejected from the nozzles H2. The bank 112 is formed to partition off the lower opening 112c around the pixel electrode 111 and the ink-jet head H1 is aimed at the pixel electrode face 111a in the lower opening 112c. Droplets 110c of the first solution are ejected onto the electrode face 111a, while the ink-jet head H1 and the substrate 2 are moved in relation to each other. The volume of each droplet from the ejection nozzles H2 is controlled.

As the first solution, composition produced by dissolving mixtures of a polythiophene derivatives s, e.g., poly-ethylene-dioxythiophene (PEDT), and, e.g., polystyrene sulphonic acid (PSS) in polar solvents, can be employed. Polar solvents include water, isopropyl alcohol (IPA), normal butanol, γ-butyrolactone, N-methylpyrrolidone (NMP) and 1,3-dimethyl-2-imidazolydine (DMI) and their derivatives and glycol ether family members such as Carbitol acetate or butyl Carbitol acetate. A more specific listing of the first solution constituents is the following: PEDT/PSS mixture (PEDT/PSS=1:20) 12.52 weight %; IPA, 10-weight %; NMP, 27.48 weight %; and DMI, 50-weight %. The viscosity of the first solution is preferably about 0.002-0.020 Pa-s (2-20 cPs); viscosity of 0.004-0.015 Pa-s (4-15 cPs) is desirable.

By using the above first solvent, stable ejection can be assured without blockages in the ejection nozzle H2.

The same hole injection/transfer layer materials may be used for the red (R), green (G) and blue (B) light-emitting layers 110b1-110b3, or the materials may be changed for each layer.

As shown in FIG. 10, the ejected droplets 110c of the first solution spread out on the electrode face 111a and the first deposited layer 112e, which were treated to be lyophilic. They fill the lower and upper openings 112c and 112d. Even if ejected droplets 116c of the first solution missed the intended location for coverage and were ejected onto the upper surface 112f, the upper surface 112f would not be wetted by the ejected droplets 110c of the first solution; they would run down to the lower and upper openings 112c and 112d.

The volume of the first solution ejected onto the electrode face 111a is set by the size of the lower and upper openings 112c and 112d, by the thickness of the hole injection/transfer layer to be formed, by the concentration of the hole injection/transfer layer material in the first solution, and by other factors.

Droplets 110c of the first solution may be ejected onto the same electrode face 111a multiple times rather than once. If this is done more than once, the volume of the first solution need not be the same every time, and can be changed at each application. Also, the first solution need not be ejected onto the same portions of the electrode face 111a every time; it can be applied to different portions on the electrode face 11a at different applications.

Figure 13:
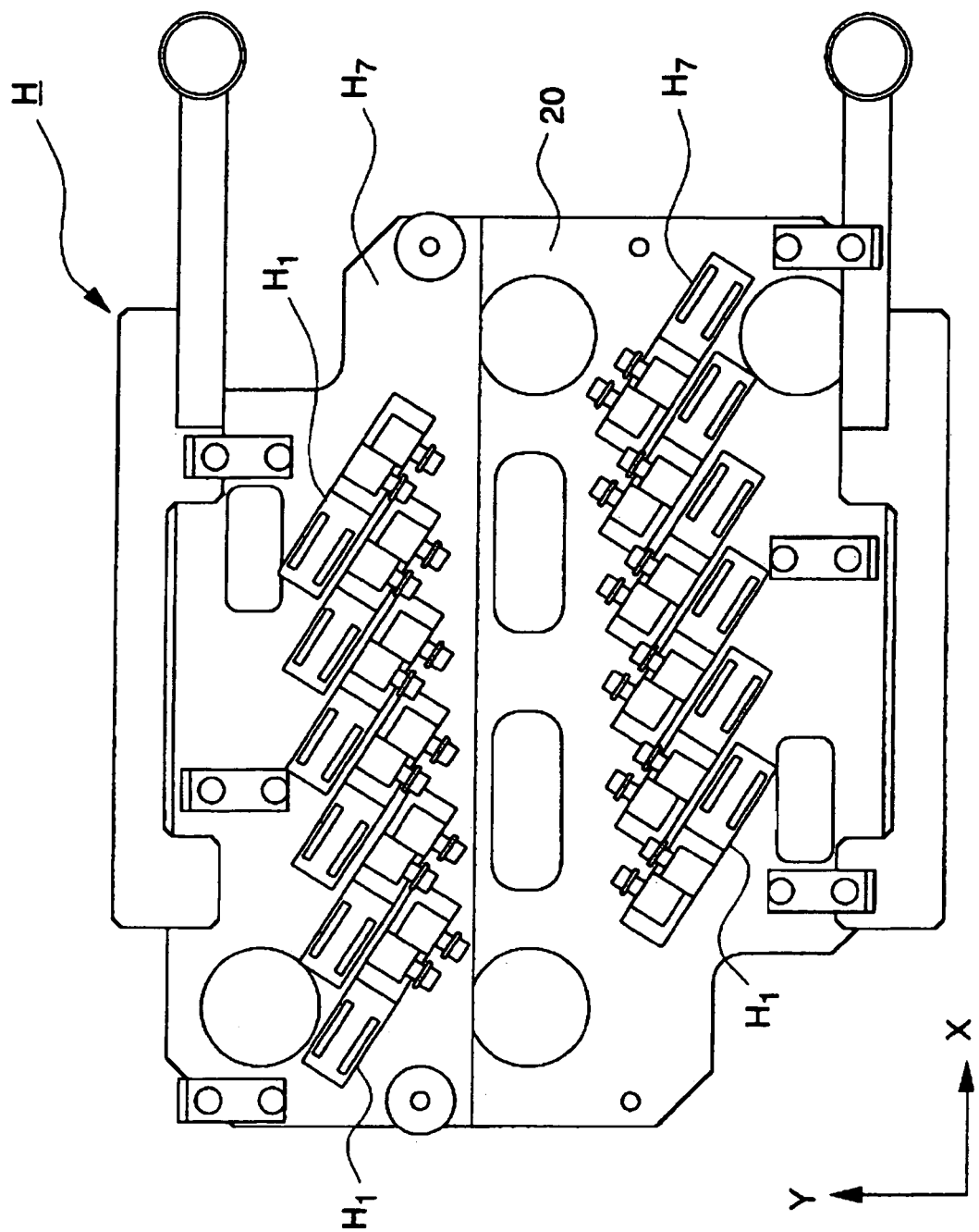
FIG. 13 is a plan drawing illustrating the head block used in manufacturing the display device for the first embodiment of this invention.
Figure 14:
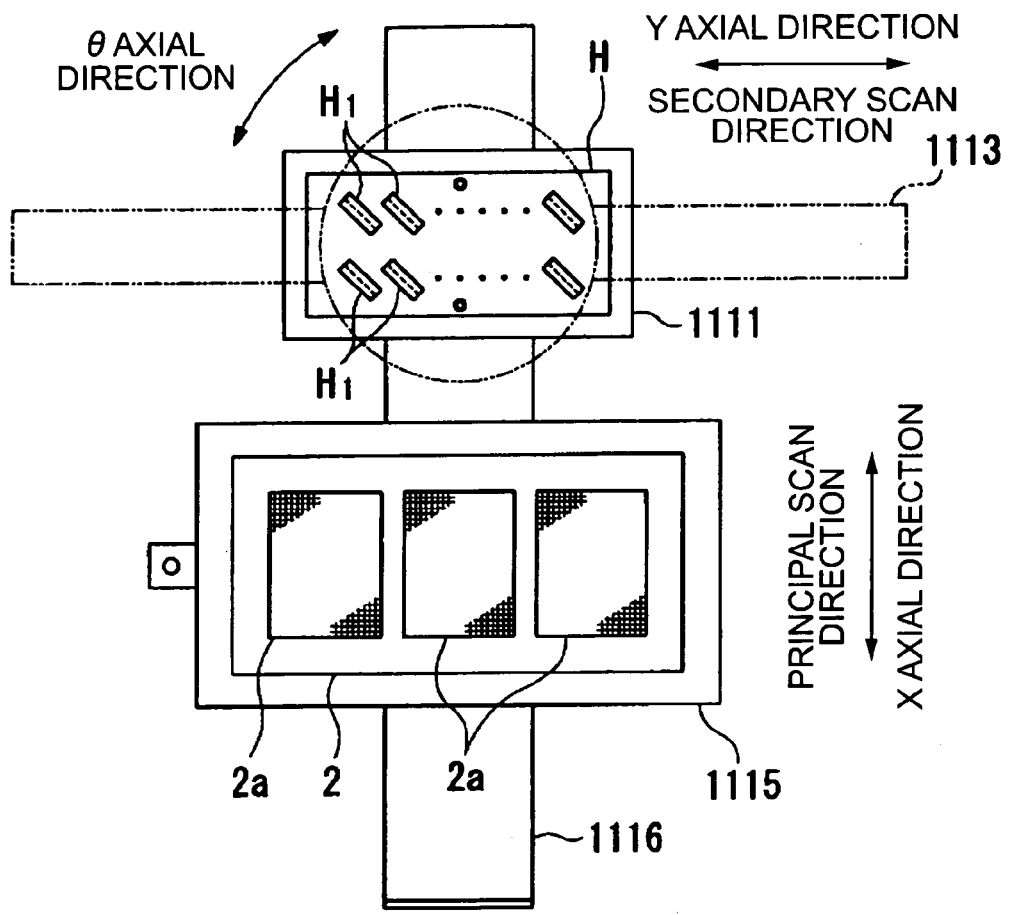
FIG. 14 is a plan drawing illustrating the ink-jet apparatus used in manufacturing the display device for the first embodiment of this invention.
Figure 15:
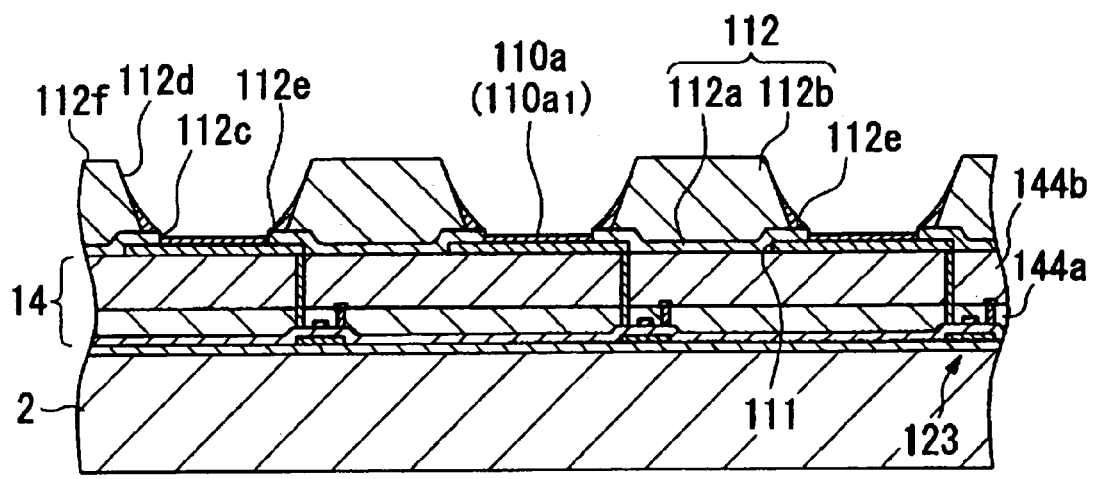
FIG. 15 is a process drawing describing the method of manufacturing the display device for the first embodiment of this invention.

It is possible to use a head H of the structure shown in FIG. 13. It is preferable for the substrate and ink-jet heads to be arranged as shown in FIG. 14. In FIG. 13, "H7" indicates the supporting substrate that supports the inkjet head H1. Multiple ink-jet heads H1 are provided on the supporting substrate H7.

Multiple ejection nozzles are established in the ink ejection face (facing the substrate) of the ink-jet heads in 2 rows (for example, 180 nozzles in each row, for a total of 360 nozzles) in parallel to the lengthwise direction of the head with spacing in the lateral direction of the head between the rows. These ink-jet heads H1 are inclined at a certain angle with respect to the X axis (or Y axis) while the nozzles are directed toward the substrate. At the same time, they are arranged in two rows in the Y direction, at a certain spacing, supported and maintained in multiple positions by the supporting substrate 20 (FIG. 13 shows 6 in each row, for a total of 12), which has an approximately rectangular shape as seen from the planar direction.

Also, in the inkjet apparatus shown in FIG. 14, "1115" indicates the stage which positions the substrate 2 and "1116" indicates the guide rail which directs the stage 1115 in the X direction (principal scan direction) shown in the figure. The head H can also be moved in the Y direction shown in the figure (secondary scan direction) by the guide rail 1113 via the supporting component 1111. The head H is allowed to rotate in the θ axial direction shown in the figure, in order to tilt the ink-jet head H1 at a certain angle with respect to the principal scan direction. Thus, by arranging the ink-jet heads at an inclination with respect to the scan direction, it is possible to set the nozzle pitch to the pitch of the pixels. Also, by adjusting the angle of inclination, any pitch of the pixels can be accommodated.

Figure 11:
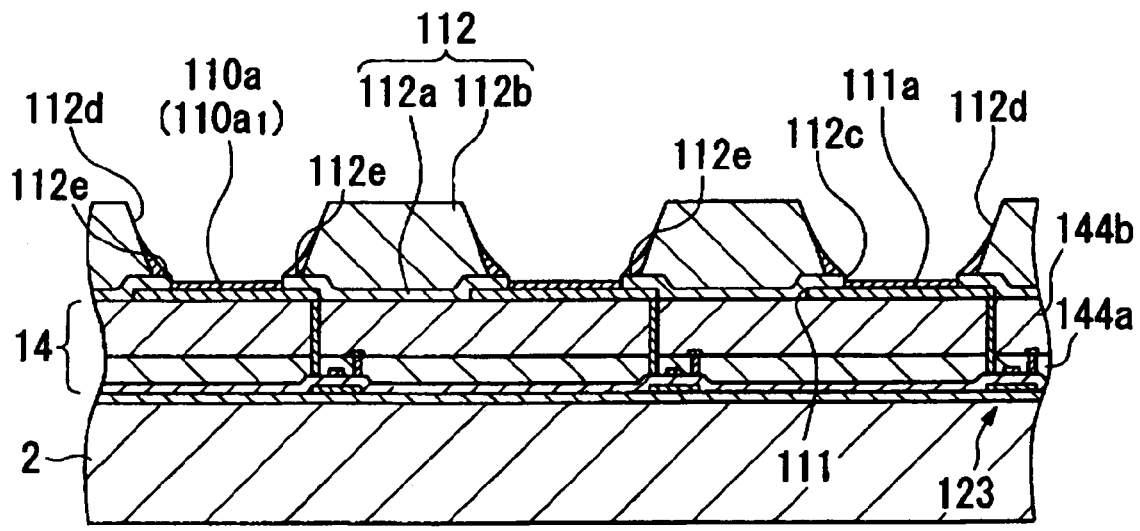
FIG. 11 is a process drawing describing the method of manufacturing the display device for the first embodiment of this invention.
Figure 12:
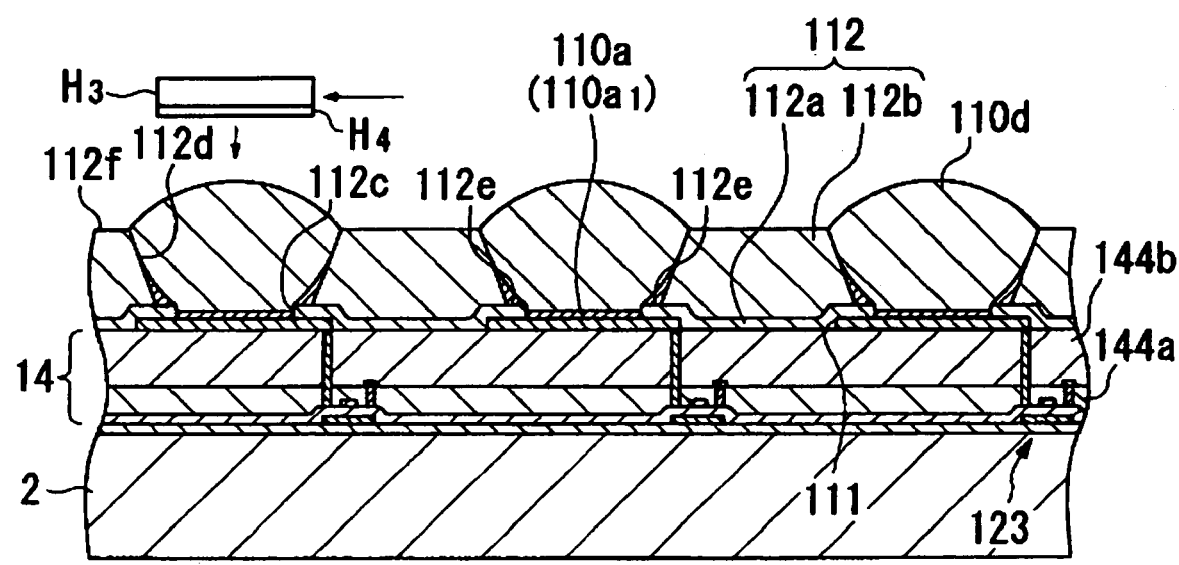
FIG. 12 is a process drawing describing the method of manufacturing the display device for the first embodiment of this invention.

Next, the drying treatment process is carried out, as shown in FIG. 11. By this treatment, the first solution is dried after ejection, the polar solvents included in the first solution are evaporated, and the hole injection/transfer layer 110a is formed.

When the drying treatment is carried out, evaporation of the polar solvent included in the droplets 110c of the first solution mainly occurs near the inorganic bank layer 112a and the organic bank layer 112b. As the polar solvent evaporates, the hole injection/transfer layer material is thickened and extracted.

At the same time, there also occurs evaporation of the polar solvent from the electrode face 111a due to the drying treatment, and this forms the flat component 110a1, which is made of the material for the hole injection/transfer layer on the electrode face 111a. Since the speed of evaporation of the polar solvent on the electrode face 111a is nearly uniform, the hole injection/transfer layer material is concentrated in a uniform way on the electrode face 111a, and because of this, the flat component 110a1 is formed at a uniform thickness.

This is how the hole injection/transfer layer 110a is formed from the edge and the flat component 110a1.

The above drying treatment is performed under, for example, a nitrogen atmosphere and a pressure of, for example, about 133.3 Pa (1 Torr). Excessively low pressure is not preferable because it causes the droplets 110c of the first solution to evaporate. Also, if the temperature is higher than room temperature, evaporation of the polar solvent is accelerated, preventing formation of a flat film.

After the drying treatment, the substrate with the formed hole injection/transfer layer is placed in, for example, a nitrogen atmosphere, in the chamber where the drying treatment was performed, or after transfer to a pass box (a chamber which is evacuated or filled with an inert gas). The pressure is then lowered to or below 1 Pa, preferably, to about 0.1 Pa. Also, preferably, the substrate is heated after evacuation to a temperature 200° C. or below. Then, preferably, after depressurization, the chamber is filled with nitrogen gas to $10^5$ Pa. It is allowed for the filling gas to include a molecular equivalent of the solvent of the second solution, described below. Also, preferably, the depressurization and filling is carried out multiple times (for example, 2 or 3 times). In this way, any polar solvent and water existing in the atmosphere near the hole injection/transfer layer 110a are effectively removed.

Thus, the reason for thoroughly eliminating the solvent existing in the first solution (or the solvent) is that the light-emitting layer formed from the second solution, described later, is oxidized by the polar solvent (especially water) included in the first solvent, and is easily deteriorated.

In the above process for formation of the hole injection/transfer layer, although the droplets 110c of the first solution fill the lower and upper openings 112c and 112d, the first solution is repelled by the organic bank layer 112b, which has been made lyophobic, and runs into the lower and upper openings 112c and 112d. Because of this, the droplets 10c of the first solution will always be able to fill the lower and upper openings 112c and 112d, and it will be possible to form the hole injection/transfer layer 110a on the electrode face 11a.

(4) Emissive Layer Formation Process

Next, the light-emitting layer formation process constitutes the light-emitting layer material ejection process and the drying process.

Next, as the light-emitting layer formation process, after the second solution including the light-emitting layer material is ejected onto the hole injection/transfer layer 110a by the ink-jet method (droplet ejection method) and dried, the light-emitting layer 110b is formed on the hole injection/transfer layer 110a.

Figure 16:
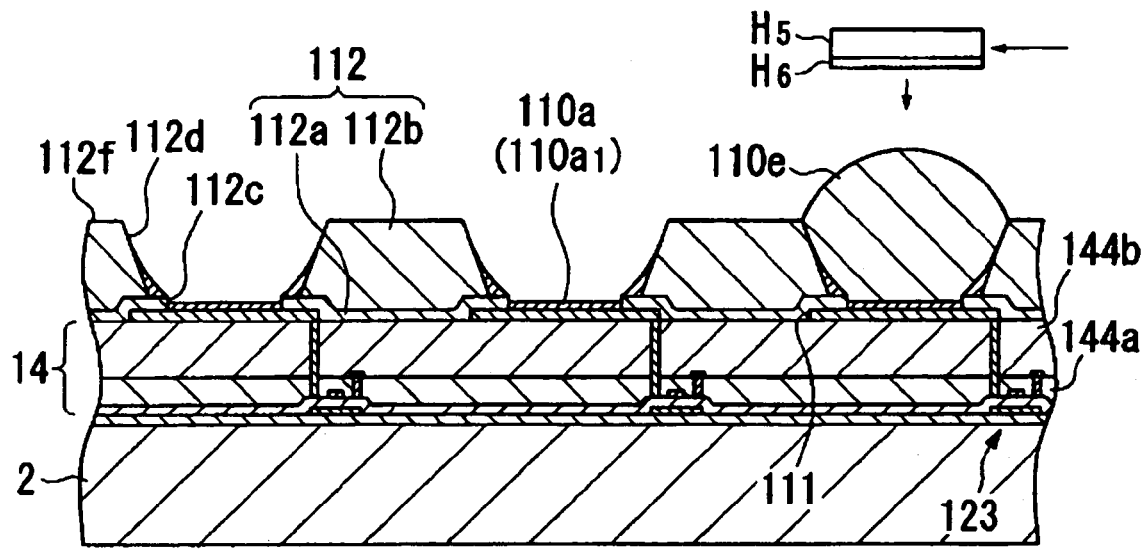
FIG. 16 is a process drawing describing the method of manufacturing the display device for the first embodiment of this invention.

FIG. 16 shows the method of ejection using ink-jets. As shown in FIG. 16, the ink-jet head H5 is moved in relation to the substrate 2, and the second solution including light-emitting layer material of each color (for example, here, blue (B)) is ejected from the ejection nozzles H6 formed on the ink-jet head.

During ejection, the ejection nozzles are pointed at the hole injection/transfer layer 110a located in the lower and upper openings 112c and 112d and the second solution is ejected while moving the ink-jet head H5 and the substrate 2 in relation to each other. The volume ejected from the ejection nozzles H6 is controlled to that of a single droplet. This is how a controlled volume (liquid droplets 110e of the second solution) is ejected from the ejection nozzles and how the droplets 110e of the second solution are ejected onto the hole injection/transfer layer 110a.

The materials for forming the light-emitting layer are the aforementioned [CHEMICAL1]-[CHEMICAL5], or polyfluorene derivatives, polyphenylene derivatives, polyvinyl carbazole, polytheophene derivatives, or these polymeric materials where such as a perylene dye, a coumarin dye or a rhodamine dye, such as rubrene, perylene, 9, 10-diphenyl anthracene, tetraphenyl butadiene, Nile red, coumarin 6 or quinacridone are doped.

As non-polar solvents, compounds which are insoluble in the hole injection/transfer layer 110a are preferable, such as cyclohexylbenzene, dihydrobenzofuran, trimethylbenzene, tetramethylbenzene.

By using non-polar solvents in the second solution for the light-emitting layer 110b, the second solution can be applied without re-dissolving the hole injection/transfer layer 110a.

As shown in FIG. 16, the ejected droplets 110e of the second solution spread out over the hole injection/transfer layer 110a and fill the interior of the lower and upper openings 112c and 112d. At the same time, even if the droplets 110e of the first solution miss the intended location and are ejected onto the upper surface 112f, which has been made lyophobic, the upper surface 112f remains un-wetted by the droplets 110e of the second solution; the droplets 110e of the second solution run into the lower and upper openings 112c and 112d.

The volume of the second solution ejected onto the hole injection/transfer layer 110a is set by the size of the lower and upper openings 112c and 112d, by the thickness of the light-emitting layer 110b to be formed, by the concentration of the light-emitting layer material in the second solution, and by other factors.

Droplets 110e of the second solution may be ejected onto the same hole injection/transfer layer 111a multiple times rather than once. If this is done more than once, the volume of the second solution need not be the same every time, and can be changed at each application. Also, the second solution need not be ejected onto the same portions of the hole injection/transfer layer 111a every time; it can be applied to different portions of the hole injection/transfer layer 111a at different applications.

Figure 17:
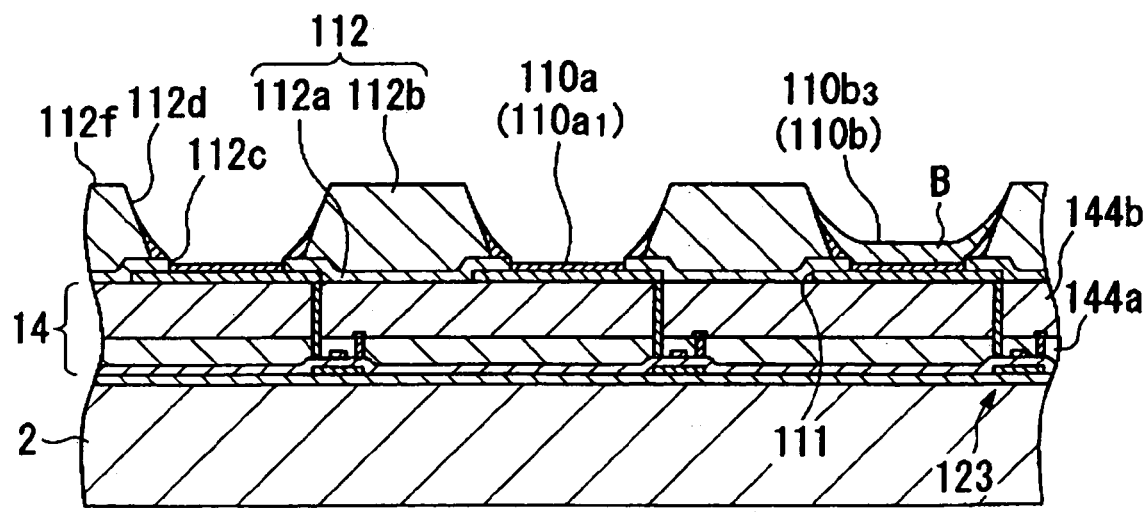
FIG. 17 is a process drawing describing the method of manufacturing the display device for the first embodiment of this invention.

Next, after ejection of the second solution to a predetermined location is finished, the light-emitting layer 110b3 is formed by drying the ejected droplets 110e of the second solution. In other words, by the drying process, the non-polar solvent included in the second solution evaporates, and the blue (B) light-emitting layer 110b3 is formed, as shown in FIG. 17. Only one of the light-emitting layers that emits blue light is illustrated in FIG. 17, but it is more clear than in FIG. 1 and the other figures that the emissive elements are formed in a matrix and that multiple light-emitting layers (for blue light) not illustrated in the drawing are formed.

Figure 18:
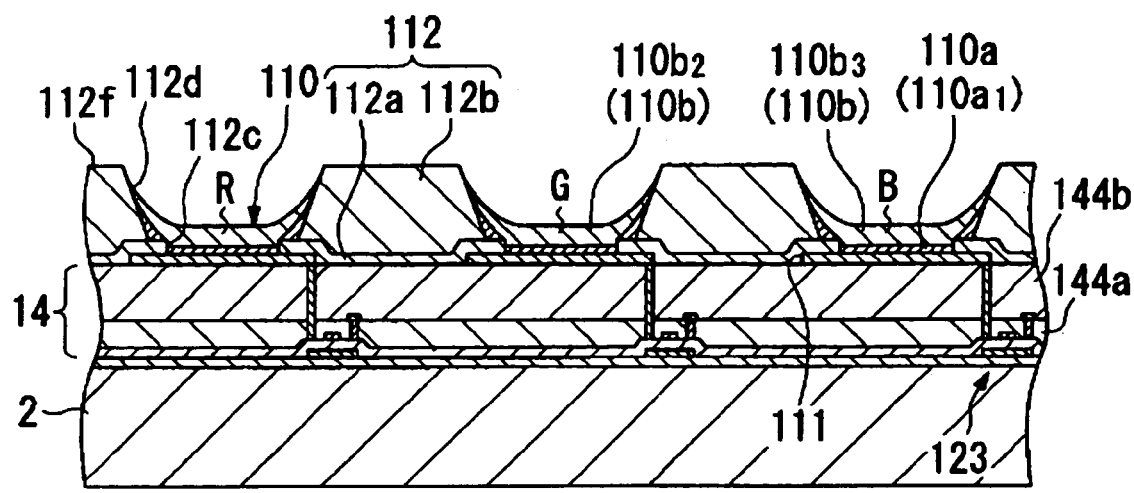
FIG. 18 is a process drawing describing the method of manufacturing the display device for the first embodiment of this invention.
Figure 19:
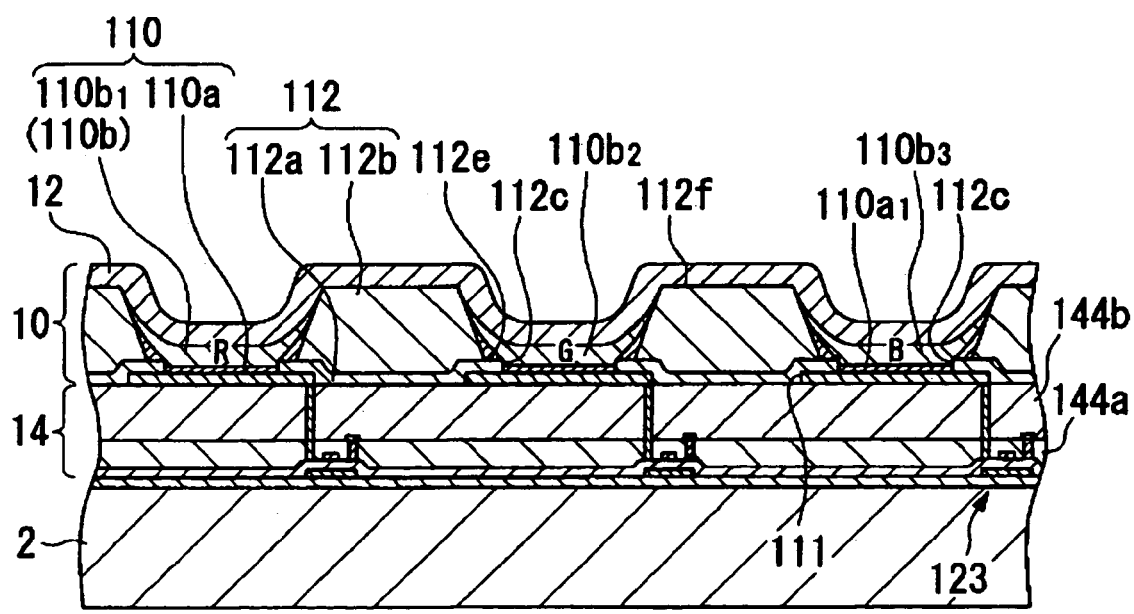
FIG. 19 is a process drawing describing the method of manufacturing the display device for the first embodiment of this invention.
Figure 20:
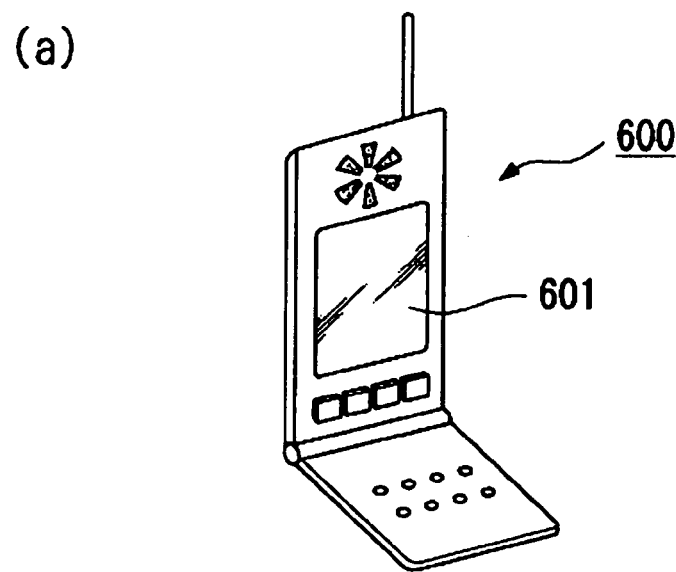
FIGS. 20(a)-20(c) are oblique perspective drawings illustrating the electronic equipment, which is the first embodiment of this invention.
Figure 20:
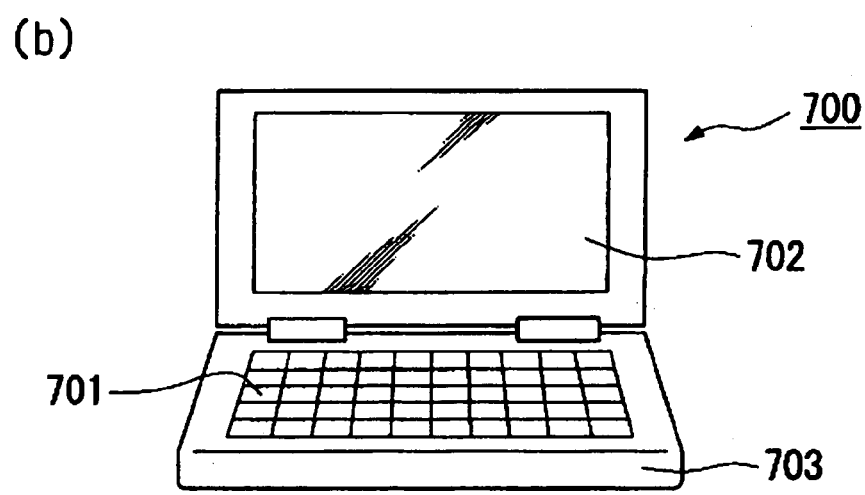
Figure 20:
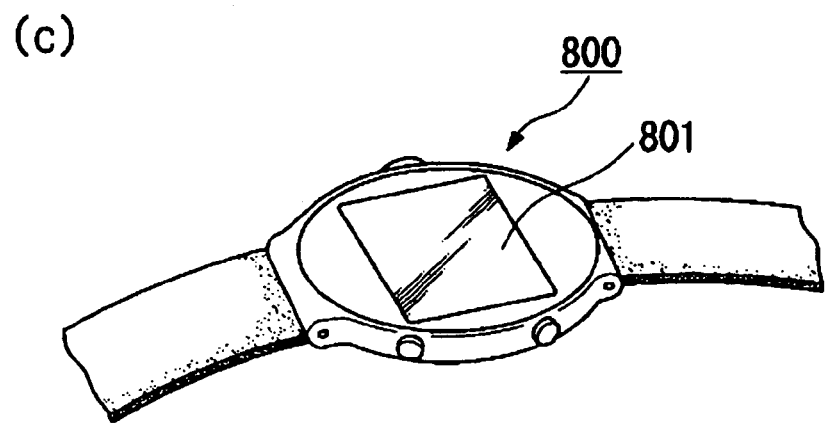
Figure 21:
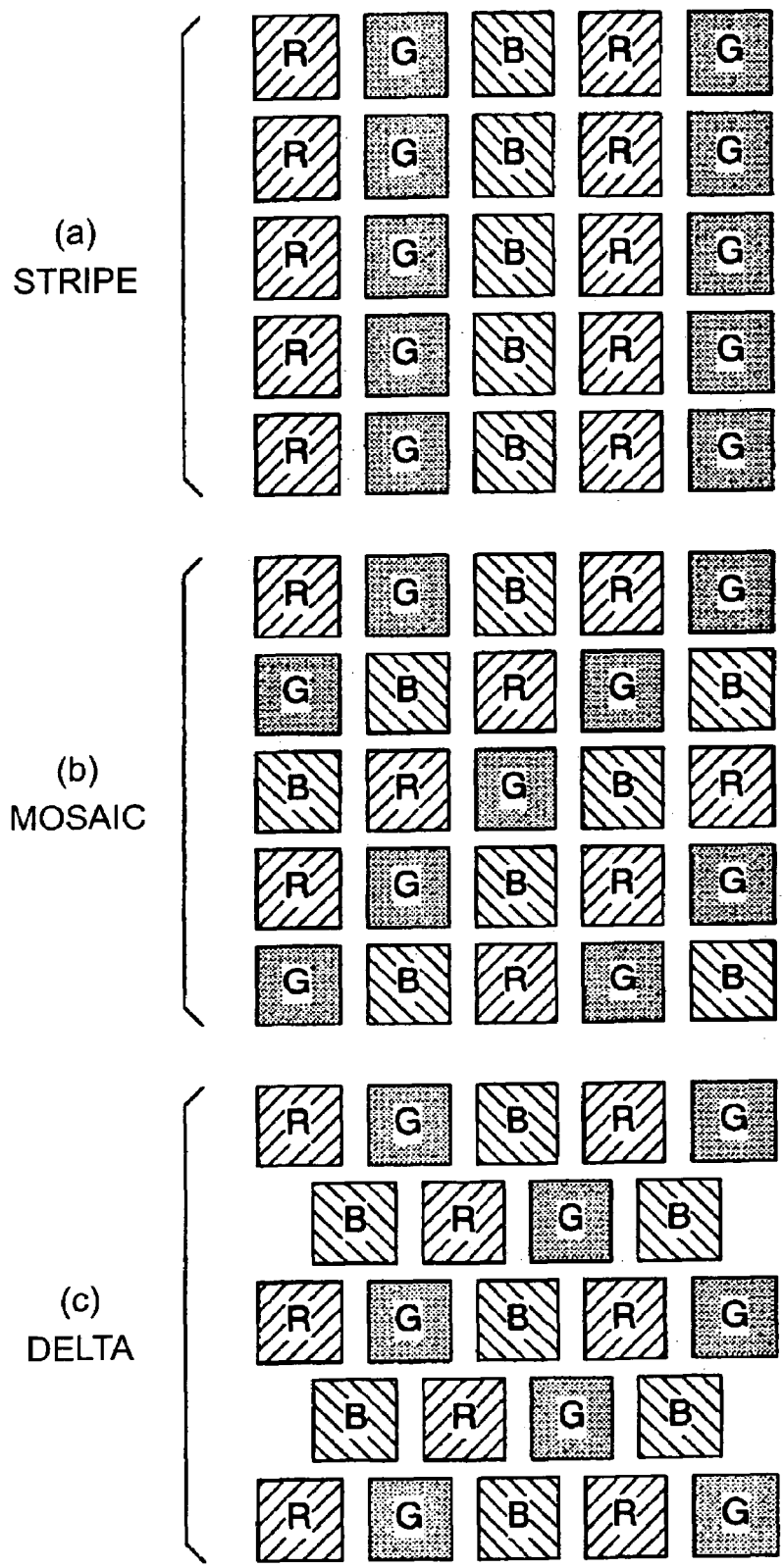
FIGS. 21(a)-(c) present plan schematic views illustrating the light-emitting layer wherein 21(a) is a stripe layout, 21(b) is a mosaic layout, and 21(c) is a delta layout.

As shown in FIG. 18, in the same processes as for the blue (B) light-emitting layer 110b3, a red (R) light-emitting layer 110b1 and, finally, a green (G) light-emitting layer 110b2 are successively formed.

The order of formation of the light-emitting layers 110b is not limited to the aforementioned order; any forming order is permissible. For example, it is possible to determine the forming order according to the light-emitting layer materials.

The condition for drying the second solution for the light-emitting layer is, for example, that 5-10 minute drying is performed in a nitrogen atmosphere with a pressure of about 133.3 Pa (1 Torr) in room temperature in the case of blue layer 110b3. Excessively low pressure is not preferable because it causes the second solution to bump. Also, the temperature is preferably no higher than room temperature, because this accelerates evaporation of the non-polar solvent, causing much of the light-emitting layer forming material to adhere to the wall face of the upper opening 112d.

In the green light-emitting layer 110b2 and the red light-emitting layer 110b1, it is preferable to dry the light-emitting layer materials very quickly, because there are a large number of components. For example, they may be sprayed with a 40° C. nitrogen flow for 5-10 minutes.

Other means of drying may be used, such as the method of irradiation with infrared radiation or of spraying with high-temperature nitrogen gas.

This is how the hole injection/transfer layer 110a and the light-emitting layer 110b are formed on the pixel electrode 111. This hole injection/transfer layer 110a corresponds to the first thin film layer in this invention, the light-emitting layer 110b corresponds to the second thin film layer in this invention, and the combination of these two correspond to the multi layered thin film in this invention.

Also, the light-emitting layer was formed with an ink-jet apparatus, as described above, but the invention is not limited to this embodiment, and the light-emitting layer may also be formed by vapor deposition.

(5) Opposing Electrode (Negative Electrode) Formation Process

Next, in the opposing electrode formation process, the negative electrode 12 (opposing electrode) is formed throughout the surfaces of the light-emitting layer 110b and the organic bank layer 112b. The negative electrode 12 may also be formed by depositing multiple materials. For example, it is preferable to form the side nearest the light-emitting layer of a material with a low work function, e.g. Ca, Ba or other materials may be used, or, depending on the material, it may be better to form a layer of lithium fluoride (LiF) or other material on the lower layer. It is also possible to use material(s), for example, Al, in the upper side with work function(s) higher than that in the lower layer side.

These negative electrodes 12 are preferably formed by, for example, vapor deposition, sputtering, CVD or other methods. Vapor deposition is especially preferable because it prevents damage to the light-emitting layer 110b.

Also, LiF may be formed only on the light-emitting layer 110b, and may be formed in a way to correspond with a certain color. For example, it can be formed only on the blue (B) light-emitting layer 110b3. If this is done, an upper negative electrode layer 12b made of calcium is in contact with the other light-emitting layers, the red (R) and green (G) layers 110b1 and 110b2.

It is also desirable to employ Al film, Ag film, or other materials formed by vapor deposition, sputtering, CVD or other methods for an upper layer of the negative electrode 12. It is preferable that the thickness is in the range 100-1000 nm, with about 200-500 nm being particularly desirable.

A protective layer of $SiO_2$, SiN or other material may also be deposited as a protective layer against oxidation.

(6) Sealing Process

The final process is sealing with a sealing resin 3a between the substrate 2 with the emissive element formed and the sealing substrate 3b. For example, the sealing resin 3a made of thermosetting resin or UV curing resin is applied throughout the substrate 2 and the sealing substrate 3b is applied in multiple layers on the sealing resin 3a. This process forms the sealing member 3 formed on the substrate 2.

The sealing process is preferably performed under an inert gas such as nitrogen, argon, or helium. If the process is performed under the atmosphere and if there are pinhole defects or other defects in the negative electrode 12, water, oxygen or other substances can invade the negative electrode 12 through the defects, oxidizing it, and this is not desirable.

In addition, by connecting the negative electrode 12 to the wire 5a on the example plate 5 shown in FIG. 2 and also by connecting the circuit element member 14 with drive IC6, the display apparatus 1 in this embodiment is obtained.

Second Embodiment

Next, a specific example of the electronic equipment including the organic EL device, which is a display device of this invention, is explained.

FIG. 20(a) is an oblique perspective drawing illustrating an example of a cell phone. In this figure, "600" indicates the cell phone body and "601" indicates the display component including the aforementioned organic EL device.

FIG. 20(b) is an oblique perspective drawing illustrating an example of a portable information processing equipment such as a word processor or personal computer. In this figure, "700" indicates the information processing equipment, "701" indicates input components including the keyboard, "703" indicates the body of the information processing equipment, and "702" indicates the display device including the aforementioned organic EL device.

FIG. 20(c) is an oblique perspective drawing illustrating an example of wristwatch-type electronic equipment. In this figure, "800" indicates the body of the watch, and "801" indicates the display component including the aforementioned organic EL device.

Figure 23:
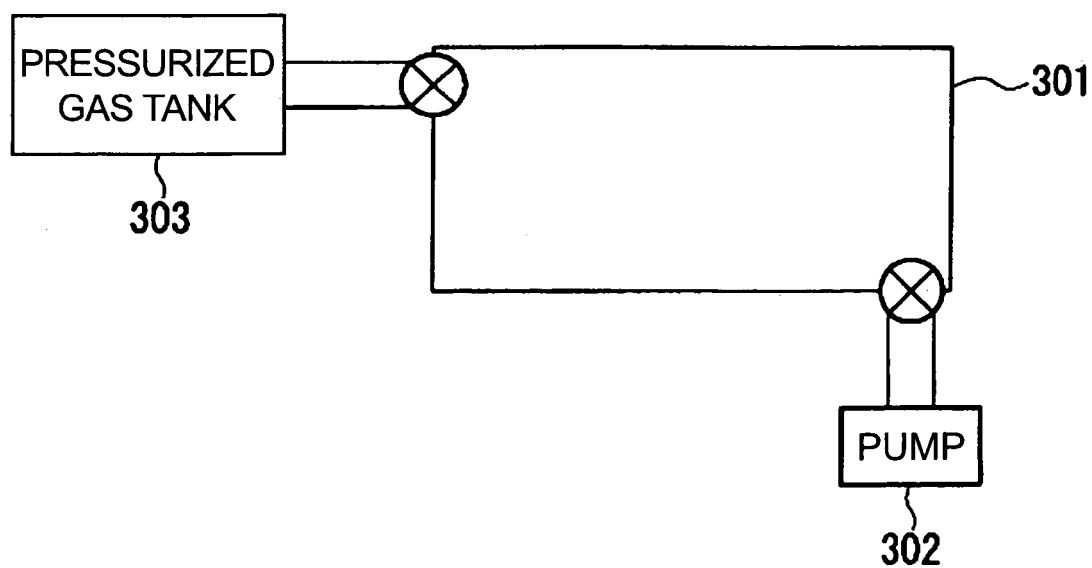
FIG. 23 shows the apparatus for depressurizing and filling with an inert gas used in an example of this invention.

Also, in the first embodiment, the case where the R, G, and B light-emitting layers 110b were arranged in a stripe pattern was explained, but this invention is not limited to this case; various layout structures may be employed. For example, besides the stripe layout shown in FIG. 21(*a*), the mosaic layout shown in FIG. 21(*b*) and the delta layout shown in FIG. 23 are also possible.

This invention is also effective for organic TFT and other kinds of elements as well as organic EL devices.

EXAMPLES

Figure 22:
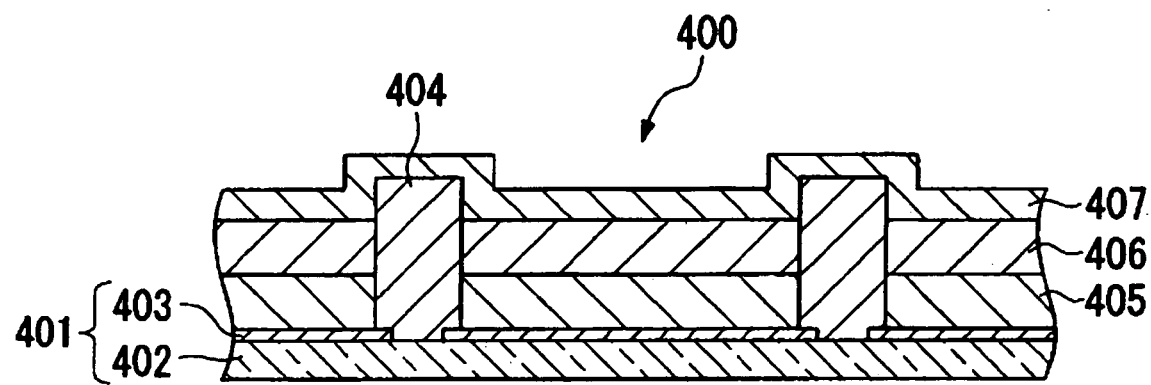
FIG. 22 is a sectional view of the organic EL element manufactured in an example of this invention and in a comparative example.

As shown in FIG. 22, a substrate 401 was prepared with an attached transparent ITO electrode (positive electrode) on a glass plate 402 on which separating walls 404 are provided for pixel patterning by the ink-jet method. PEDT ink, a mixture of polyethylene dioxythiophene (PEDT) and polystyrene sulphonic acid (PSS) (PEDT/PSS=1:20 weight ratio), 20-weight % and water, 80-weight %, was applied to the aforementioned substrate 401 by the ink-jet method. This was dried with heating treatment in a nitrogen atmosphere at a pressure of 133.3 Pa at 200° C. for 20 minutes. This was transferred to the decompression chamber/inert gas chamber 301 (with a nitrogen atmosphere) shown in FIG. 23. The atmosphere was pumped out of the decompression chamber/inert gas chamber 301 with a pump 302 down to a pressure of 0.1 Pa and the chamber was heated in 200° C. for 10 minutes. Then, the decompression chamber/inert gas chamber 301 was filled with nitrogen gas from the nitrogen tank 303 to a pressure of $10^5$ Pa (1 Atm). This decompression-filling cycle was repeated twice and the hole injection/transfer layer 405 was formed.

Next, the substrate coated with the PEDT was transferred to the ink-jet apparatus. Ink made from a 1 weight %/vol. solution of the polyfluorene derivatives shown in CHEMICAL 1 where rubrene is doped was applied to the substrate with the apparatus. After this application, a light-emitting layer 406 was formed on the substrate under heat treatment at 100° C. and under a $10^5$ Pa (1 Atm) nitrogen atmosphere.

Ca was deposited on the light-emitting layer to a depth of 20 nm by vapor deposition, and on this, a 200 nm film of Al was deposited with vapor deposition to create the negative electrode 407.

This is how the organic EL element 400 was made in this example.

For comparison, an organic EL element was created by the same method as for the aforementioned formation of a hole injection/transfer layer, except that no evacuation or filling with inert gas was performed (comparative example).

Figure 24:
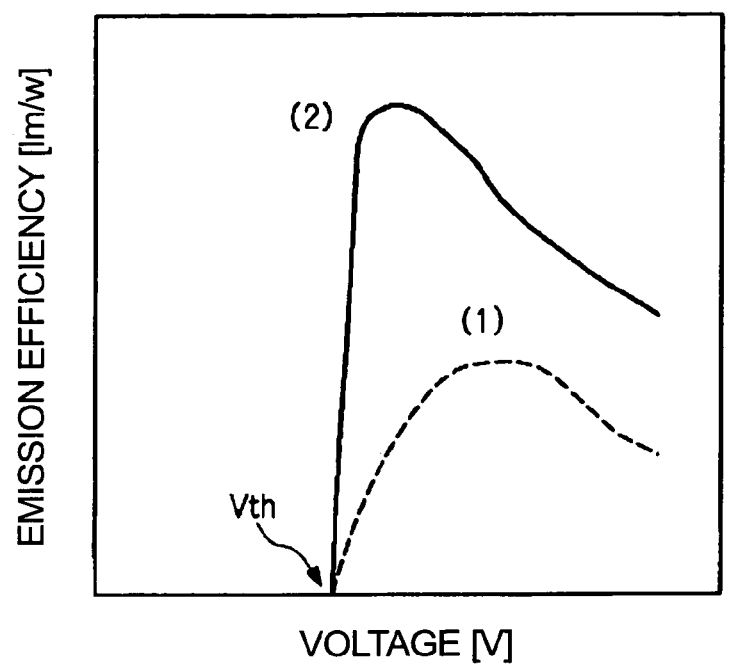
FIG. 24 is a graph showing the measured emission efficiency of the organic EL element with respect to voltage variations in an example of this invention and in a comparative example.
Figure 25:
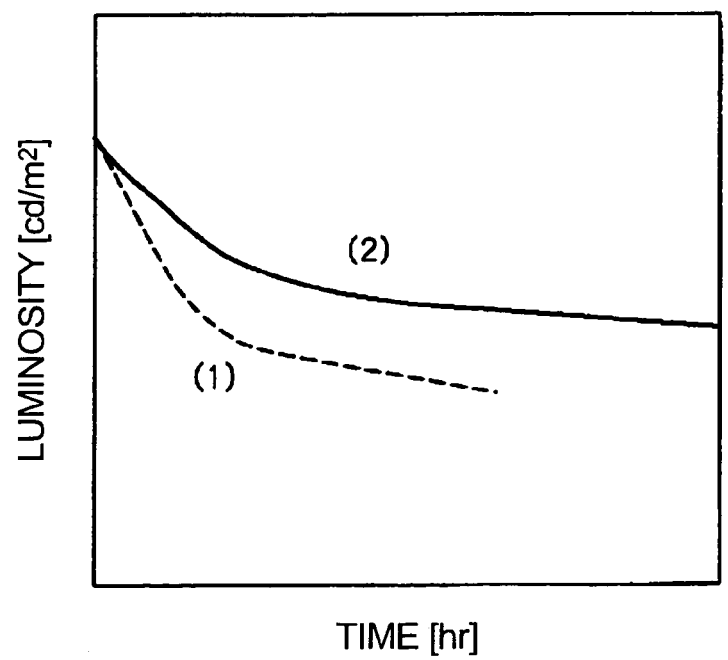
FIG. 25 is a graph showing the measured time-related changes in luminance of the organic EL device element in an example of this invention and in a comparative example.

The efficiency with respect to voltage and the time-related changes in luminance at constant current corresponding to a predetermined initial luminance for this organic EL element were measured. The results are shown in the graphs in FIG. 24 and FIG. 25. In these graphs, (1) indicates the data of the comparative example and (2) indicates the data of this example. "Vth" in FIG. 24 is the threshold voltage.

From these graphs, it is clear that both emission efficacy and luminance in this example are superior to those of the comparative example.

According to the thin film manufacturing method in this invention, because the vapor of the solvent used as the raw material for manufacture of this thin film is removed from the vicinity of the surface of the thin film, even if another film is formed afterward on the surface of the thin film, there are no damaging effects from the vapor on the other film.

What is claimed is:

1. A method of forming a pattern, the method comprising:
   forming a first film on a substrate, the forming of the first film including depositing a first liquid material that includes a first solvent and a first component; and
   forming a second film on the first film, the forming of the second film including depositing a second liquid material that includes a second solvent that has a polarity different from a polarity of the first solvent and a second component,
   the forming of the first film further including drying the first liquid material deposited on the substrate in the presence of a vapor of the second solvent.

2. The method according to claim 1, wherein the formation of the first film includes evaporation of the first solvent of first liquid droplet applied on the substrate.

3. The method according to claim 1, wherein the formation of the first film includes a heat treatment of a first liquid droplet applied on the substrate.

4. The method according to claim 1, wherein the second film is to be formed on the first film.

5. The method according to claim 1, wherein a conversion of the first liquid material into the first film is carried out in the presence of the vapor of the second solvent.

6. The method according to claim 1, in the drying of the substrate, reducing a pressure of a chamber and filling the chamber with nitrogen gas and the vapor of the second solvent.

7. A manufacturing of an organic EL device, the method comprising:
   forming at least one of a hole injection layer and a hole transfer layer on a substrate, the forming of the at least one of the hole injection layer and the hole transfer layer including depositing a first liquid material that includes a first solvent and a first component; and
   forming a light-emitting layer on a layer that is formed in the forming of at least one of a hole injection layer and a hole transfer layer, the forming of the light-emitting layer including depositing a second liquid material that includes a second solvent that has a polarity that is different from a polarity of the first solvent,
   the forming of at least one of the hole injection layer and the hole transfer layer further including drying the first liquid material deposited on the substrate in the presence of a vapor of the second solvent.

8. The method according to claim 7, wherein the formation of the at least one of the hole injection layer and the hole transfer layer includes an evaporation of the solvent of the first liquid material applied on the substrate.

9. The method according to claim 7, wherein the formation of the at least one of the hole injection layer and the hole transfer layer includes a heat treatment of the first liquid material applied on the substrate.

10. The method according to claim 7, wherein a conversion of the first liquid material into the at least one of the hole injection layer and the hole transfer layer is carried out in the presence of the vapor of the second solvent.

11. The method according to claim 7, in the drying of the substrate, reducing a pressure of a chamber and filling the chamber with nitrogen gas and the vapor of the second solvent.

* * * * *

UNITED STATES PATENT AND TRADEMARK OFFICE
CERTIFICATE OF CORRECTION

PATENT NO.         : 7,273,637 B2
APPLICATION NO. : 10/392287
DATED                : September 25, 2007
INVENTOR(S)      : Katsuyuki Morii It is certified that error appears in the above-identified patent and that said Letters Patent is hereby corrected as shown below:

| | |
|---|---|
| Column 2, Line 60: | "solvent" should be --solvent.-- |
| Column 6, Line 35: | after "is" insert --a-- |
| Column 8, Line 61: | "a" should be --an-- |
| Column 8, Line 62: | "a" should be --an-- |
| Column 9, Line 16: | "a", 1st occurrence, should be --an-- |
| Column 10, Line 13: | "electrode-111" should be --electrode 111-- |
| Column 10, Line 30: | "derivatives," should be --derivatives.-- |
| Column 10, Line 31: | "dopinga" should be --doping a-- |
| Column 13, Line 13: | after "necessary." insert the following: |

Figure 6:
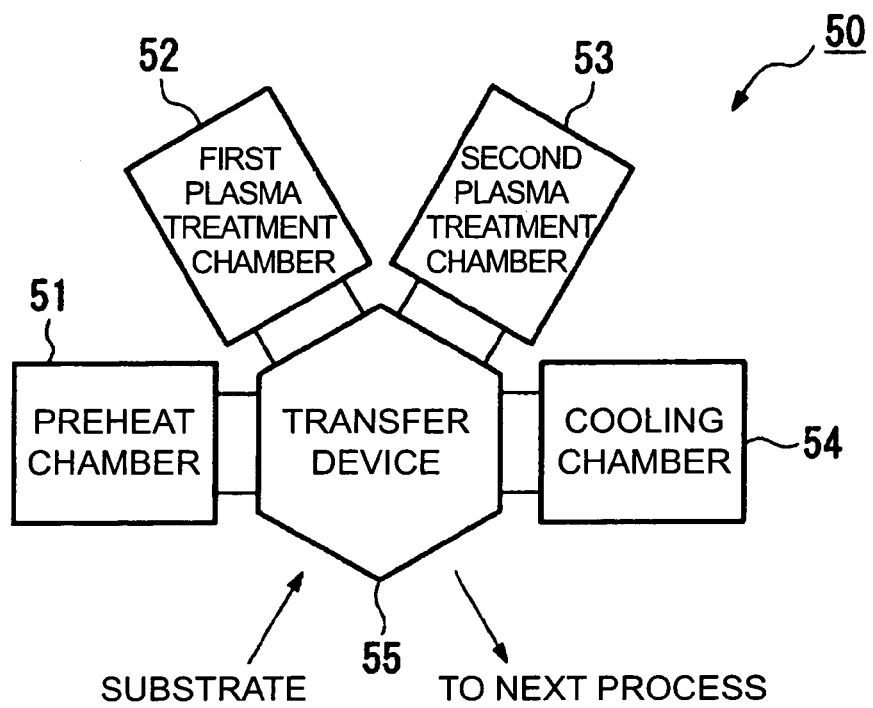
FIG. 6 is a plan schematic view illustrating an example of the plasma treatment apparatus used for manufacturing the display device for the first embodiment of this invention.

First, the plasma treatment apparatus used for the plasma treatment process is shown in Fig. 6.

The plasma treatment apparatus 50 comprises a preheat chamber 51, a first plasma treatment chamber 52, a second plasma treatment chamber 53, a cooling chamber 54, and a transfer apparatus 55, that transfers the substrate 2 among chambers 51 – 54. Each chamber of the preheat chamber 51 –to the cooling chamber 54, is arranged in a radial pattern around the transfer apparatus 55.

UNITED STATES PATENT AND TRADEMARK OFFICE
CERTIFICATE OF CORRECTION

PATENT NO. : 7,273,637 B2
APPLICATION NO. : 10/392287
DATED : September 25, 2007
INVENTOR(S) : Katsuyuki Morii It is certified that error appears in the above-identified patent and that said Letters Patent is hereby corrected as shown below:

First, the process will be described using these apparatus.

Pre-heating process is carried out in the preheat chamber 51, as shown in Fig. 6. The substrate 2 is heated in this processing chamber 51 to a set temperature after the bank formation process. After pre-heating process, the processes to induce lyophilic and lyophobic properties are performed. In other words, the substrate is transferred to the first and second plasma treatment chambers 52 and 53, and in those processing chambers, plasma treatment is performed to effect lyophilic properties in the bank 112. Treatment to effect lyophobic properties is performed after the treatment to effect lyophilic properties. After the treatment to effect lyophobic properties, the substrate is transferred to the cooling chamber 54 and cooled to room temperature. After this cooling, the substrate is transferred with the transfer apparatus to the next process, where the hole injection/transfer layer is formed.

UNITED STATES PATENT AND TRADEMARK OFFICE
CERTIFICATE OF CORRECTION

PATENT NO. : 7,273,637 B2
APPLICATION NO. : 10/392287
DATED : September 25, 2007
INVENTOR(S) : Katsuyuki Morii It is certified that error appears in the above-identified patent and that said Letters Patent is hereby corrected as shown below:

Below, each process is explained in detail.

(2) – ((1)) Pre-heating process

| | |
|---|---|
| Column 16, Line 5: | after "of" delete "a" |
| Column 16, Line 29: | "116c" should be --110c-- |
| Column 16, Line 47: | "11a" should be --111a-- |
| Column 18, Line 4: | "10c" should be --110c-- |
| Column 18, Line 8: | "11a." should be --111a.-- |
| Column 18, Line 67: | "111a" should be --110a-- |
| Column 19, Line 6: | "111a" should be --110a-- |
| Column 22, Line 16: | after "of" insert --a-- |

Signed and Sealed this

Fifth Day of August, 2008

JON W. DUDAS
*Director of the United States Patent and Trademark Office*